(12) United States Patent
Ding et al.

(10) Patent No.: US 11,604,233 B2
(45) Date of Patent: Mar. 14, 2023

(54) MAGNETIC SENSING DEVICE FOR LID

(71) Applicant: Google LLC, Mountain View, CA (US)

(72) Inventors: Yao Ding, San Jose, CA (US); Hui Li, Mountain View, CA (US)

(73) Assignee: Google LLC, Mountain View, CA (US)

( * ) Notice: Subject to any disclaimer, the term of this patent is extended or adjusted under 35 U.S.C. 154(b) by 301 days.

(21) Appl. No.: 17/096,069

(22) Filed: Nov. 12, 2020

(65) Prior Publication Data

US 2021/0063499 A1 Mar. 4, 2021

Related U.S. Application Data

(63) Continuation of application No. 16/672,741, filed on Nov. 4, 2019, now Pat. No. 10,866,290.

(60) Provisional application No. 62/793,456, filed on Jan. 17, 2019.

(51) Int. Cl.
*G01R 33/07* (2006.01)
*H02J 50/10* (2016.01)
*H02J 7/02* (2016.01)

(52) U.S. Cl.
CPC ............ *G01R 33/072* (2013.01); *H02J 7/025* (2013.01); *H02J 50/10* (2016.02)

(58) Field of Classification Search
CPC ........ G01R 33/072; H02J 7/025; H02J 50/10; G06F 1/1677
See application file for complete search history.

(56) References Cited

U.S. PATENT DOCUMENTS

| 10,397,682 | B2 * | 8/2019 | Chawan | ................. A45C 11/00 |
| 10,866,290 | B2 * | 12/2020 | Ding | ..................... H02J 7/025 |
| 2008/0278269 | A1 * | 11/2008 | Ramirez | ............... G06F 1/1679 |
| | | | | 335/205 |

(Continued)

FOREIGN PATENT DOCUMENTS

| CN | 102185937 A | 9/2011 |
| CN | 106559720 A | 4/2017 |

(Continued)

OTHER PUBLICATIONS

International Preliminary Report on Patentabiity for International Application No. PCT/US2019/059607 dated Jul. 29, 2021. 8 pages.

(Continued)

*Primary Examiner* — Jared Fureman
*Assistant Examiner* — Michael J Warmflash
(74) *Attorney, Agent, or Firm* — Colby Nipper PLLC

(57) ABSTRACT

The technology provides for a magnetic sensing device. The device includes a magnetic sensor configured to generate a first output triggered by a first polarity and a second output triggered by a second polarity. The device includes a first magnet, a second magnet, and a third magnet. The device may be configured such that, when the second magnet is not within a predetermined distance from the first magnet, a magnetic field from the first magnet having the first polarity causes the first output and the second output to have a first set of values. The device may be configured such that, when the second magnet is within the predetermined distance from (Continued)

the first magnet, a magnetic field from the third magnet having the second polarity causes the first output and the second output to have a second set of values.

20 Claims, 12 Drawing Sheets

(56) References Cited

U.S. PATENT DOCUMENTS

| | | | | |
|---|---|---|---|---|
| 2013/0329359 A1* | 12/2013 | Andre | ............... | H05K 5/0226 361/679.55 |
| 2014/0034080 A1* | 2/2014 | Paquet | ............... | A45C 13/1069 132/286 |
| 2014/0138378 A1* | 5/2014 | Lequeux | ............... | A45D 33/025 220/230 |
| 2017/0093079 A1* | 3/2017 | Wagman | ............... | H04R 1/1025 |
| 2017/0094390 A1* | 3/2017 | Chawan | ............... | B65D 43/16 |
| 2019/0195661 A1* | 6/2019 | Mano | ............... | G01R 33/072 |
| 2019/0242954 A1* | 8/2019 | Ding | ............... | H03K 17/9517 |
| 2019/0278337 A1* | 9/2019 | Hu | ............... | G06F 1/3206 |
| 2020/0124445 A1* | 4/2020 | Hahn | ............... | G01B 7/023 |
| 2020/0233046 A1 | 7/2020 | Ding et al. | | |

FOREIGN PATENT DOCUMENTS

| | | |
|---|---|---|
| CN | 106617580 A | 5/2017 |
| CN | 206759684 U | 12/2017 |
| EP | 2330805 A1 | 6/2011 |
| EP | 3151584 A2 | 4/2017 |

OTHER PUBLICATIONS

Office Action for Chinese Patent Application No. 201980087805.5 dated Dec. 14, 2021. 12 pages.

"Foreign Office Action", EP Application No. 19835900.2, dated May 6, 2022, 3 pages.

"Notice of Allowance", U.S. Appl. No. 16/672,741, dated Aug. 24, 2020, 8 pages.

International Search Report and Written Opinion for International Application No. PCT/US2019/059607 dated Feb. 21, 2020. 15 pages.

First Examination Report for Indian Patent Application No. 202147032114 dated Mar. 14, 2022. 6 pages.

* cited by examiner

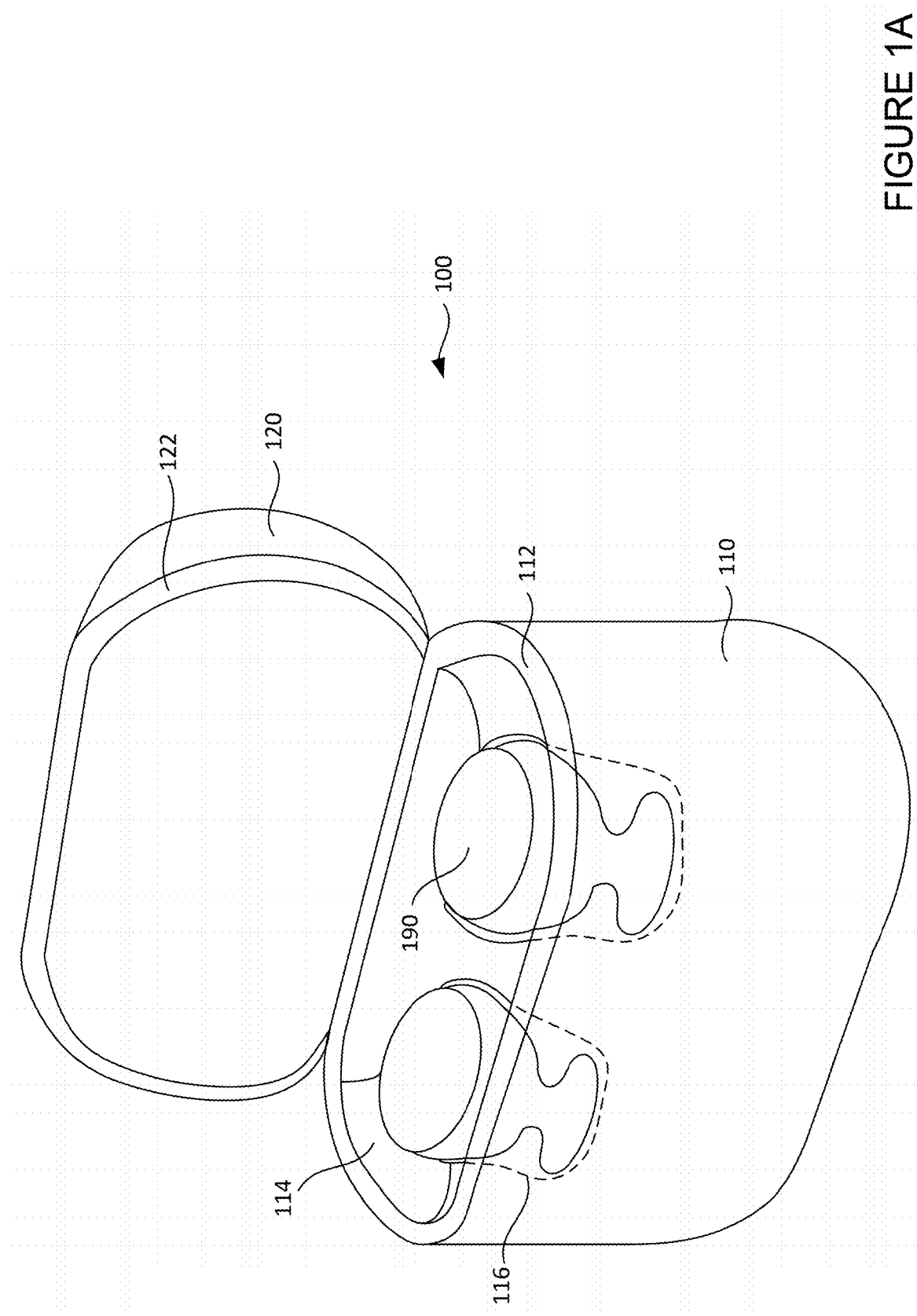

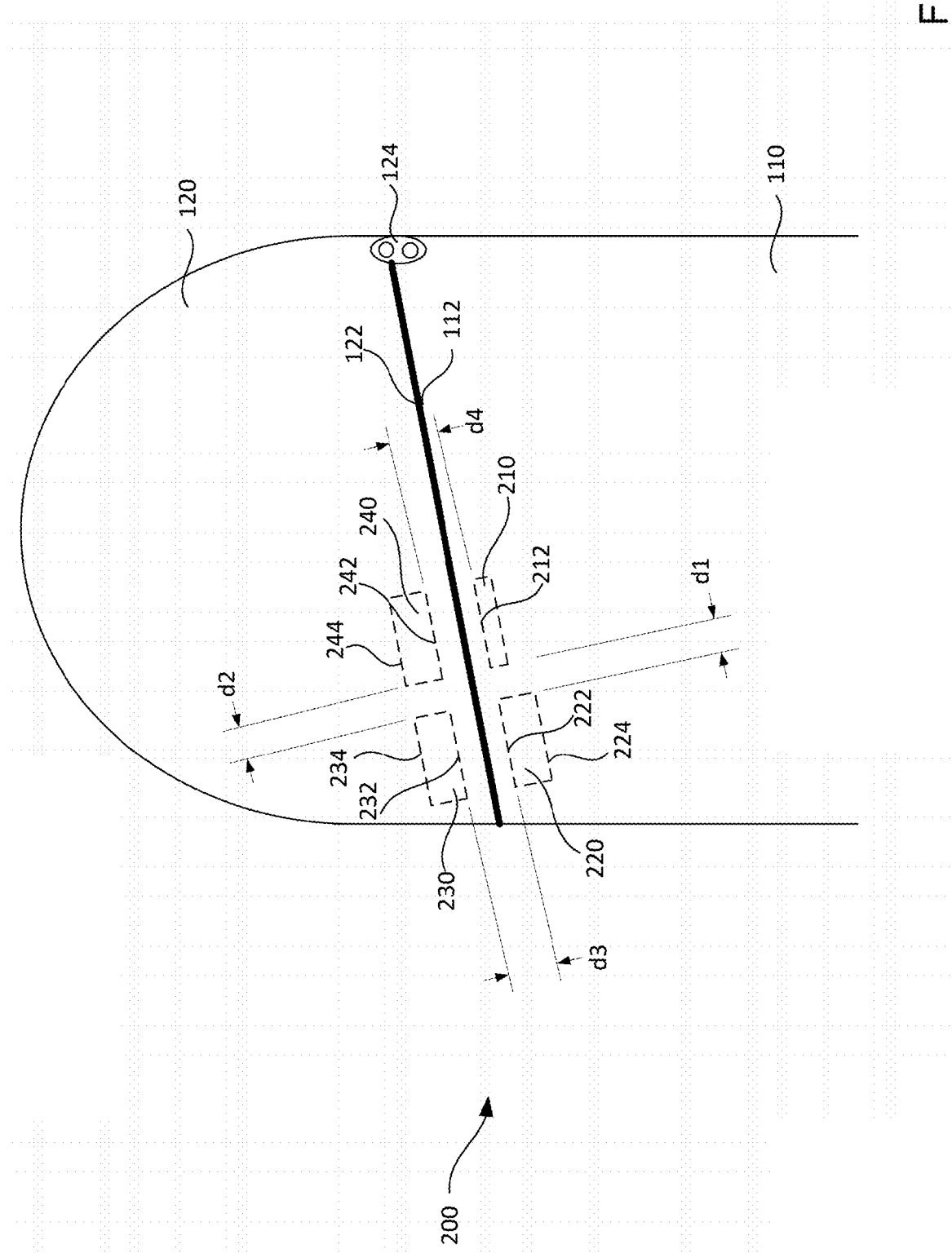

MAGNETIC SENSING DEVICE FOR LID

CROSS-REFERENCE TO RELATED APPLICATIONS

This application is a continuation of U.S. patent application Ser. No. 16/672,741, filed Nov. 4, 2019, which claims the benefit of the filing date of U.S. Provisional Patent Application No. 62/793,456 filed Jan. 17, 2019, the disclosure of which is hereby incorporated herein by reference.

BACKGROUND

Wireless devices typically require one or more batteries, such as a rechargeable battery, that provides power to the wireless devices. A case for housing wireless devices can be configured to perform various functions to support the wireless devices, including charging the batteries of the wireless devices. The case may include magnets for holding the case closed and for holding the wireless devices inside the case.

In some instances, such a case may be configured to perform charging and/or other functions based on a state of the case, such as whether the case is open or closed. In order to detect whether the case is open or closed, proximity sensors such as magnetic sensors (e.g., Hall Effect sensors) may be used. Additionally or alternatively, the case may be configured to perform charging and/or other functions based on a state of the wireless devices, such as whether the wireless devices are positioned inside the case. As such, the case may also include proximity sensors such as magnetic sensors for detecting presence of the wireless devices. Generally, determining of different states of two body elements such as a body and a lid of a case, e.g., a position including orientation of a first body element relative to a second body element, could also be advantageous in other contexts.

BRIEF SUMMARY

The present disclosure provides for a device, comprising a magnetic sensor, wherein a first output of the magnetic sensor is triggered by magnetic fields having a first polarity and a second output of the magnetic sensor is triggered by magnetic fields having a second polarity; a first magnet, the first magnet being positioned at a fixed distance from the magnetic sensor; a second magnet, the second magnet being positioned at an adjustable distance from the first magnet; wherein, when the second magnet is not within a predetermined distance from the first magnet, a magnetic field from the first magnet having the first polarity causes the first output and the second output to have a first set of values; and wherein, when the second magnet is within the predetermined distance from the first magnet, a magnetic field having the second polarity causes the first output and the second output to have a second set of values, wherein the magnetic field having the second polarity is a) from a third magnet, the third magnet being positioned at an adjustable distance from the magnetic sensor, or b) from the second magnet.

The present disclosure thus in particular provides for a device, comprising a magnetic sensor, wherein a first output of the magnetic sensor is triggered by magnetic fields having a first polarity and a second output of the magnetic sensor is triggered by magnetic fields having a second polarity; a first magnet, the first magnet being positioned at a fixed distance from the magnetic sensor; a second magnet, the second magnet being positioned at an adjustable distance from the first magnet; and a third magnet, the third magnet being positioned at an adjustable distance from the magnetic sensor; wherein, when the second magnet is not within a predetermined distance from the first magnet, a magnetic field from the first magnet having the first polarity causes the first output and the second output to have a first set of values; and wherein, when the second magnet is within the predetermined distance from the first magnet, a magnetic field from the third magnet having the second polarity causes the first output and the second output to have a second set of values.

The device may be configured such that, when the second magnet is within the predetermined distance from the first magnet, a pole of the first magnet having the first polarity may be configured to be facing a pole of the second magnet having the second polarity. The device may be configured such that, when the second magnet is within the predetermined distance from the first magnet, a pole of the third magnet having the second polarity may be configured to be facing a sensing surface of the magnetic sensor.

A strength of the first magnet may be selected based on an operating point of the magnetic sensor such that, when the second magnet is not within the predetermined distance from the first magnet, a magnetic field from a pole of the first magnet having the first polarity saturates the magnetic sensor. Additionally or alternatively, a distance between the first magnet and the magnetic sensor may be selected such that, when the second magnet is not within the predetermined distance from the first magnet, a magnetic field from a pole of the first magnet having the first polarity saturates the magnetic sensor.

A strength of the third magnet may be selected based on an operating point of the magnetic sensor such that, when the second magnet is within the predetermined distance from the first magnet, a magnetic field from a pole of the third magnet having the second polarity saturates the magnetic sensor. Additionally or alternatively, a distance between the second magnet and the third magnet may be selected such that, when the second magnet is within the predetermined distance from the first magnet, a magnetic field from a pole of the third magnet having the second polarity saturates the magnetic sensor.

A strength of the first magnet and a strength of the second magnet may be selected such that, when the second magnet is within the predetermined distance from the first magnet, a magnetic field from a pole of the first magnet and a magnetic field from a pole of the second magnet may produce a magnetic attraction force meeting a threshold holding force.

The magnetic sensor may be a dual output unipolar Hall Effect sensor.

The magnetic sensor may include a first unipolar Hall Effect sensor configured to be triggered by magnetic field of the first polarity, and a second unipolar Hall Effect sensor configured to be triggered by magnetic field of the second polarity.

The first set of values and the second set of values may be inverse of each other.

The magnetic sensor and the first magnet may be positioned within a first body element, and the second magnet and the third magnet may be positioned within a second body element, wherein one or more processors of the device may be configured to determine whether one of the first and second body elements is in a first position or a second position relative to the other one of the first and second body elements based on at least one of the first output and the second output. Accordingly, the values of the first and second output may be indicative of a position of the first and second body elements with respect to each other.

The magnetic sensor and the first magnet may be positioned within a body of a case, and the second magnet and the third magnet may be positioned within a lid of the case; and wherein one or more processors of the case may be configured to determine whether the case is open or closed based on at least one of the first output and the second output. The magnetic sensor and the first magnet may be positioned at identical or different portions of an edge of the body of the case, and the second magnet and the third magnet may be positioned at identical or different portions of an edge of the lid of the case; wherein, when the case is closed, the edge of the body may be in contact with the edge of the lid. The case may be configured to house one or more wireless devices, such as one or more wireless accessory devices, like one or more earbuds, wherein the one or more processors of the case may be configured to determine whether to charge the one or more wireless devices based on at least one of the first output and the second output.

The magnetic sensor and the first magnet may be positioned within a body of a case for housing one or more wireless devices, and the second magnet and the third magnet may be positioned within the one or more wireless devices; and wherein one or more processors of the case may be configured to determine whether the one or more wireless devices are positioned inside the case based on at least one of the first output and the second output. The device may be configured such that, when the one or more wireless devices are positioned inside the case, the second magnet of the one or more wireless devices are within the predetermined distance from the first magnet of the case. The one or more processors of the case may be configured to determine whether to charge the one or more wireless devices based on at least one of the first output and the second output.

The magnetic sensor and the first magnet may be positioned within one or more wireless devices, and the second magnet and the third magnet may be positioned within a case for housing the one or more wireless devices; and wherein one or more processors of the one or more wireless devices may be configured to determine whether the one or more wireless devices are positioned inside the case based on at least one of the first output and the second output. The device may be configured such that, when the one or more wireless devices are positioned inside the case, the second magnet of the case are within the predetermined distance from the first magnet of the one or more wireless devices. The one or more processors of the wireless devices may be configured to determine whether to communicate with the case based on at least one of the first output and the second output.

The present disclosure further provides for a device, comprising a magnetic sensor, wherein a first output of the magnetic sensor is triggered by magnetic field having a first polarity and a second output of the magnetic sensor is triggered by magnetic field having a second polarity; a first magnet, the first magnet being positioned at a fixed distance from the magnetic sensor; and a second magnet, the second magnet being positioned at an adjustable distance from the first magnet; wherein, when the second magnet is not within a predetermined distance from the first magnet, a magnetic field from the first magnet having the first polarity causes the first output and the second output to have a first set of values; and wherein, when the second magnet is within the predetermined distance from the first magnet, a magnetic field from the second magnet having the second polarity causes the first output and the second output to have a second set of values.

The device may be configured such that, when the second magnet is within the predetermined distance from the first magnet, a pole of the first magnet having the first polarity is configured to be facing a pole of the second magnet having the second polarity. The device may be configured such that, when the second magnet is within the predetermined distance from the first magnet, a pole of the second magnet having the second polarity is configured to be facing a sensing surface of the magnetic sensor.

A strength of the second magnet may be selected based on an operating point of the magnetic sensor such that, when the second magnet is within the predetermined distance from the first magnet, a magnetic field from a pole of the second magnet having the second polarity saturates the magnetic sensor.

The magnetic sensor and the first magnet may be positioned within a body of a case, and the second magnet may be positioned within a lid of the case; and wherein one or more processors of the case may be configured to determine whether the case is open or closed based on at least one of the first output and the second output.

The magnetic sensor and the first magnet may be positioned within a body of a case for housing one or more wireless devices, and the second magnet may be positioned within the one or more wireless devices; and wherein one or more processors of the case may be configured to determine whether the one or more wireless devices are positioned inside the case based on at least one of the first output and the second output.

The present disclosure further provides for a case, comprising a body; a lid, the lid moveable with respect to the body between an opening and a closing position a magnetic sensor positioned at the body, wherein a first output of the magnetic sensor is triggered by magnetic field having a first polarity and a second output of the magnetic sensor is triggered by magnetic field having a second polarity; a first magnet positioned at the body, the first magnet being positioned at a fixed distance from the magnetic sensor; a second magnet positioned at the lid; a third magnet positioned at the lid, the third magnet being positioned at a fixed distance from the second magnet; wherein, when the lid is in the opening position and the case is open, a magnetic field from the first magnet having the first polarity causes the first output and the second output to have a first set of values; and wherein, when the lid is in the closing position and the case is closed, a magnetic field from the third magnet having the second polarity causes the first output and the second output to have a second set of values.

The lid may have at least an edge configured to be in contact with an edge of the body when the case is closed, the magnetic sensor and the first magnet being positioned at identical or different portions of the edge of the body and the second and third magnets being positioned at identical or different portions of the edge of the lid. The edge of the body may confine an opening at the body via which an interior of the body is accessible and which is closed by the lid when in the closing position.

BRIEF DESCRIPTION OF THE DRAWINGS

FIGS. 1A and 1B are diagrams illustrating an example case in accordance with aspects of the disclosure.

FIGS. 2A and 2B are diagrams illustrating an example magnetic sensing device in accordance with aspects of the disclosure.

DETAILED DESCRIPTION

Overview

Figure 1B:
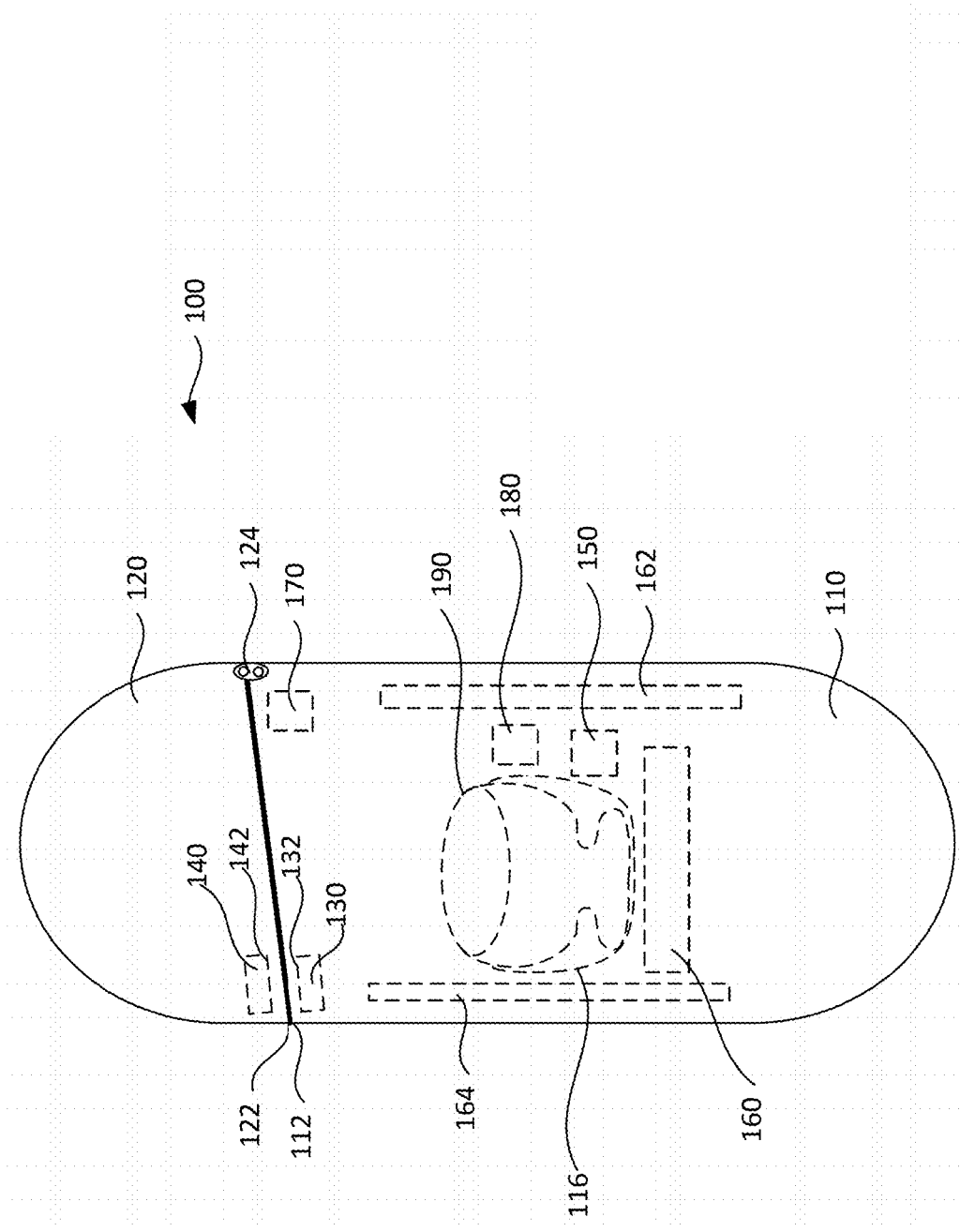

The technology disclosed may generally relate to a magnetic sensing device in a case for housing one or more wireless devices. As mentioned above, a case for housing wireless devices may be configured to support functions of the wireless devices, such as charging the wireless devices. However, charging the wireless devices continuously may be inefficient. For example, the wireless devices may initially be packaged inside the case in a factory, and may not reach a user for an extended period of time. Charging the wireless devices during this time may be wasteful, since the charges may later be depleted before reaching the user. Further, regulations may prohibit charging during transit, such as regulations of the International Air Transport Association (IATA). As such, the user may be disappointed when initially opening the case only to discover that the wireless devices cannot turn on, for example when attempting to wirelessly connect the wireless devices to other user devices. To avoid such disappointing out of box experience, the wireless devices may be charged fully before packaging, and set in a shipping mode (e.g., a low power, inactive mode) in transit to conserve energy. Even then, the wireless devices may still reach the user completely discharged, since the time for shipping, stocking in retail stores, etc. can be many months.

To further ensure a good out of box experience for the user, the case may be configured to charge the wireless devices upon initial opening by the user. For instance, in order to change from shipping mode to active mode, charger of the wireless devices may need to turn on charging for at least a short period of time. Further as mentioned above, IATA rules strictly prohibit charging during shipping. As such, the detection of case opening must be reliable in order to prevent the charger to unexpectedly turn on and initiate charging during transit, as well as to ensure that the charger deactivates shipping mode upon initial opening by the user. In this regard, proximity sensors, such as magnetic sensors mentioned above, may be used in detecting the initial case opening. However, where the case has compact dimensions, magnets from different circuitry of the case may interfere with the magnetic sensors of the case, causing unreliable detection and even damage to the magnetic sensors. To address these issues, a magnetic sensing device may be configured to reduce or eliminate the effects of interference.

In one example, the magnetic sensing device includes a magnetic sensor, a first magnet, a second magnet, and a third magnet. The magnetic sensor is configured such that a first output of the magnetic sensor is triggered by magnetic fields having a first polarity (e.g., North) and a second output of the magnetic sensor is triggered by magnetic fields having a second polarity (e.g., South). For example, the magnetic sensor may be a dual output unipolar Hall Effect sensor, where the first output is triggered by the first polarity (e.g., North), and a second output triggered by the second polarity (e.g., South). For another example, the magnetic sensor may include two unipolar Hall Effect sensors, a first unipolar Hall Effect sensor configured to be triggered by the first polarity (e.g., North), and a second unipolar Hall Effect sensor configured to be triggered by the second polarity (e.g., South). The magnetic sensing device is configured such that the first magnet is positioned at a fixed distance from the magnetic sensor, the second magnet is positioned at an adjustable distance from the first magnet, and the third magnet is positioned at an adjustable distance from the magnetic sensor. As a specific example, the first magnet and the magnetic sensor may be positioned in a body of a case for housing wireless devices, while the second magnet and the third magnet may be positioned in a lid of the case.

The magnetic sensing device is configured such that, when the second magnet is not within a predetermined distance from the first magnet, a magnetic field from the first magnet having the first polarity causes the first output and the second output to have a first set of values. Continuing from the specific example above, when the case is open, the second magnet and the third magnet in the lid of the case are far from the body of the case, but the first magnet is always in the body of the case at a fixed distance from the magnetic sensor. As such, the magnetic sensor in the body of the case detects the North pole from the first magnet (also in the body of the case), but does not receive magnetic fields from the second magnet or third magnet (which are in the lid of the case), and generates the first set of values as the first output and second output.

The magnetic sensing device is further configured such that, when the second magnet is within the predetermined distance from the first magnet, a magnetic field from the third magnet having the second polarity causes the first output and the second output to have a second set of values. Again continuing from the specific example above, when the case is closed, the second magnet and the third magnet in the lid of the case both come close to the body of the case. As such, when the second magnet in the lid of the case is within the predetermined distance from the first magnet in the body of the case, interactions between the second magnet and the first magnet, as well as proximity of the third magnet to the magnetic sensor, cause the magnetic sensor to detect the South pole from the third magnet in the lid, and to generate the second set of values as the first output and second output.

Thus, the magnetic sensing device may be used in a case for housing wireless devices such that a state of the case may be determined based on values of the first output and the second output. When the case is open, the values of the first output and the second output of the magnetic sensor may be triggered by the first magnet inside the body. In contrast, when the case is closed, the values of the first output and the second output of the magnetic sensor may be triggered by the third magnet inside the lid.

In some instances, the magnetic sensing device may be configured such that, when the case is open, the magnetic sensor is saturated by a magnetic field with the first polarity, and when the case is closed, the magnetic sensor is saturated by a magnetic field of the second polarity. Maintaining the magnetic sensor in saturation reduces or eliminates effect of interference from other magnets in the case or in the surroundings of the case. For instance, when deeply saturated, it would require a very strong magnetic field with an opposite polarity to reverse one or more outputs of the magnetic sensor. In contrast, when not deeply saturated, even weak interference may reverse one or more outputs of the magnetic sensor.

In other instances, a strength of the first magnet and a strength of the second magnet are selected such that, when the second magnet is within the predetermined distance from the first magnet, a magnetic field from a pole of the first magnet and a magnetic field from a pole of the second magnet produce a magnetic attraction force sufficient to hold the case closed. By configuring the first magnet and the second magnet for both purposes of holding the case closed and for detection of case state, an overall number of magnets in the case may be reduced.

To further reduce the number of magnets, another example magnetic sensing device includes a magnetic sensor, a first magnet, and a second magnet. The magnetic sensing device is configured such that the first magnet is positioned at a fixed distance from the magnetic sensor, and the second magnet is positioned at an adjustable distance from the first magnet. As a specific example, the first magnet and the magnetic sensor may be positioned in a body of a case for housing wireless devices, while the second magnet may be positioned in a lid of the case. For example, the magnetic sensor may be one dual output unipolar Hall Effect sensor, or two unipolar Hall Effect sensors. As such, the magnetic sensor is configured such that a first output of the magnetic sensor is triggered by magnetic fields having a first polarity (e.g., North) and a second output of the magnetic sensor is triggered by magnetic fields having a second polarity (e.g., South).

The magnetic sensing device is configured such that, when the second magnet is not within a predetermined distance from the first magnet, a magnetic field from the first magnet having the first polarity triggers the first output and the second output to have a first set of values. Continuing from the specific example above, when the case is open, the second magnet in the lid of the case is far from the body of the case. As such, the magnetic sensor in the body of the case detects the North pole from the first magnet (also in the body of the case), but does not receive magnetic fields from the second magnet (which is in the lid of the case), and generates the first set of values as the first output and second output.

The magnetic sensing device is further configured such that, when the second magnet is within the predetermined distance from the first magnet, a magnetic field from the second magnet having the second polarity triggers the first output and the second output to have a second set of values. Again continuing from the specific example above, when the case is closed, the second magnet in the lid of the case comes close to the body of the case. As such, when the second magnet in the lid of the case is within the predetermined distance from the first magnet in the body of the case, interactions between the second magnet and the first magnet, as well as proximity of the second magnet to the magnetic sensor, cause the magnetic sensor to detect the South pole from the second magnet in the lid, and to generate the second set of values as the first output and second output.

Additionally or alternatively, the magnetic sensing device may be used in the case and one or more wireless devices such that a state of the one or more wireless devices may be determined based on values of the first output and the second output. For example, the magnetic sensor and the first magnet may be positioned inside the case, while the second magnet and the third magnet may be positioned inside the one or more wireless devices. As such, when the wireless devices are inside the case, the values of the first output and the second output may be triggered by the first magnet inside the case. In contrast, when the wireless devices are inside the case, the values of the first output and the second output may be triggered by the third magnet inside the wireless devices.

The technology is advantageous because it provides reliable proximity detection, for example each state of a case may cause the magnetic sensor to be triggered by a different polarity. Configurations that cause deep saturation of the magnetic sensor may further reduce or eliminate effects of interference from other magnetic components, thereby improving detection reliability. By improving detection reliability, the technology may, for example, improve out of box experience for wireless devices without risking violating regulations or wasting energy. The improved detection reliability may also conserve energy during later use, since the case may determine whether to initiate various functions based on the state of the case and/or the state of the wireless devices. Features of the technology further provides for reducing the number of magnets required by configuring one or more magnets in the magnetic sensing device for performing multiple functions, which may reduce cost of manufacturing.

Example Devices

FIGS. 1A and 1B are pictorial diagrams illustrating an example case 100. FIG. 1A shows a perspective view of the case 100 and FIG. 1B shows a side view of the case 100. The case 100 may be configured to house one or more wireless devices. For example as shown in FIG. 1A, the case 100 houses a pair of wireless earbuds 190. The earbuds 190 may be wireless in that they do not require a wired connection to a music player, phone, or other device to be powered. The earbuds 190 may include one or more batteries that provide power to the earbuds 190 and other components therein, such as transceivers, sensors, amplifiers, processors, etc.

The case 100 includes a body 110 and a lid 120 such that the case 100 may be opened or closed by moving the lid 120 relative to the body 110. As shown in FIG. 1A, when the case 100 is open, an edge 112 of the body 110 is not in contact with an edge 122 of the lid 120. Further, earbuds 190 may be placed inside or taken out of the open case 100. As shown in FIG. 1B, when the case 100 is closed, the edge 112 of the body 110 is in contact with the edge 122 of the lid 120. Further, the earbuds 190 may be enclosed in the case 100. As shown in FIG. 1B, the lid 120 is attached to the body 110 via a hinge 124. Alternatively, the lid 120 may be attached to the body 110 via other mechanisms, or may be detachable from the body 110.

When the earbuds 190 are placed inside the case 100, the case 100 may protect the earbuds 190 from shock and/or contaminants in the environment. In this regard, the case 100 may be made of any of a number of materials, such as plastic, ceramic, etc. As shown in FIG. 1A, the case 100 includes a cover layer 114 such that the cover layer 114 and the body 110 forms an enclosed space for housing electronic components of the case 100. As such, electronic components of the case 100 may be protected from contaminants in the environment. The cover layer 114 may be made of any of a number of materials, such as plastic, ceramic, etc. Additionally or alternatively, the case 100 may include a cover layer (not shown) that forms an enclosed space with the lid 120. Further as shown in FIG. 1A, to better accommodate and retain the earbuds 190, the case 100 may include grooves 116 in the cover layer 114 with similar shapes and dimensions as the earbuds 190.

For housing small wireless devices like the earbuds 190, the case 100 may have small dimensions. For example, the widths, lengths, and/or heights of the case 100 may be in the range of 5 cm-10 cm. Although the case 100 in this example is shown as rectangular with rounded corners, the case 100 may alternatively have a number of other shapes, such as cylindrical, cubic, etc.

Referring to FIG. 1B, the case 100 includes one or more magnets for holding the lid 120 to the body 110 in order to keep the case 100 closed. This way, for example, if the case is dropped, the contents inside the case would not fall out. For example, a magnet 130 may be positioned near or at the edge 112 of the body 110 and a magnet 140 may be positioned near or at the edge 122 of the lid 120. The magnet 130 and the magnet 140 may be configured so that, when the case 100 is closed, the magnet 130 and the magnet 140 come within a predetermined distance with each other. For example, the predetermined distance may be a few millimeters. The magnet 130 and the magnet 140 may be configured such that, when the case 100 is closed, a pole 132 of the magnet 130 with a first polarity is facing a pole 142 of the magnet 140 with a second polarity. The first polarity and the second polarity may be opposite. For example, the first polarity may be North and the second polarity may be South. This way, a magnetic attraction force between the magnet 130 and the magnet 140 may keep the case 100 closed.

The case 100 further includes one or more magnets for holding the earbuds 190 inside the case 100. This way, for example, if a user places the earbuds 190 inside the case 100 but does not close the case 100, the earbuds 190 would not fall out. For example, a pair of magnets 150 may be positioned inside the case 100 such that, when the earbuds 190 are positioned inside the case 100, the earbuds 190 are each within a predetermined distance from one of the pair of magnets 150 in the case 100. For example, the predetermined distance may be a few millimeters. In this regard, the pair of magnets 150 may be positioned inside the cover layer 114, such as in or near the grooves 116. As such, a magnetic attraction force of the pair of magnets 150 may act on a material in the earbuds 190 to hold the earbuds 190 in the grooves 116 of the case 100. In some examples, the pair of magnets 150 may instead be one magnet large enough to hold both of the earbuds 190. Additionally, the earbuds 190 may also include one or more magnets (not shown) configured to come within a predetermined distance from the pair of magnets 150 in the case 100 so that a magnetic attraction force between the pair of magnets 150 and the magnets of the earbuds 190 may hold the earbuds 190 inside the case 100.

In addition to housing the earbuds 190, the case 100 includes additional components supporting or augmenting various functions of the earbuds 190. The additional components may be housed inside the space enclosed by the body 110 and the cover layer 114. For instance, the case 100 may include charging circuitry 160, which may be configured to deliver a charge to the batteries of the earbuds 190. For example, the charging circuitry 160 may include a battery. For another instance, the case 100 may include speaker circuitry 162 for broadcasting audio received by the earbuds 190. For example, speakers may be used for operating the case 100 as a wireless speaker to play music, or to emit audio for translated speech, etc. For still another instance, the case 100 may further include one or more transceivers (not shown) for communicating with transceivers of the earbuds 190.

The case 100 may include additional magnets as part of the circuitry for these additional components. For example, one or more magnets may be provided in the charging circuitry 160 of the case 100 for aligning with charging circuitry in the earbuds 190 for wireless charging. Alternatively or additionally, the pair of magnets 150 described above for holding the earbuds 190 inside the case 100 may be configured to also align the earbuds 190 for charging. For another example, one or more magnets may be provided in the speaker circuitry 162 of the case 100.

The case 100 may include one or more processors 164 for controlling the charging circuitry 160, the speaker circuitry 162, the one or more transceivers, and/or other components of the case 100. For example, the processors 164 of the case 100 may be configured to determine whether the case 100 should perform one or more functions based on one or more states of the case 100. For instance as discussed above, to conserve energy and to abide by regulations, the processors 164 may determine not to allow the case 100 to charge the earbuds 190 when initially packaged and shipped out from factory. However, the processors 164 may determine to allow the case 100 to initiate charging once the case 100 is first opened by a user to ensure good out of box experience for the user. For another instance, after the initial charging, the processors 164 of the case 100 may further determine whether to initiate charging based on whether the case 100 is open or closed, and/or an amount of charge in the battery of the case 100.

Additionally, the processors 164 of the case 100 may be configured to determine whether the case 100 should perform one or more functions based on one or more states of the earbuds 190. For instance, the processors 164 of the case 100 may determine whether to initiate charging, communication, and/or broadcasting functions based on whether the earbuds 190 are positioned inside the case 100. For another instance, the processors 164 of the case 100 may determine whether to initiate charging, communication, and/or broadcasting functions based on an amount of charge in the batteries of the earbuds 190.

Figure 5A:
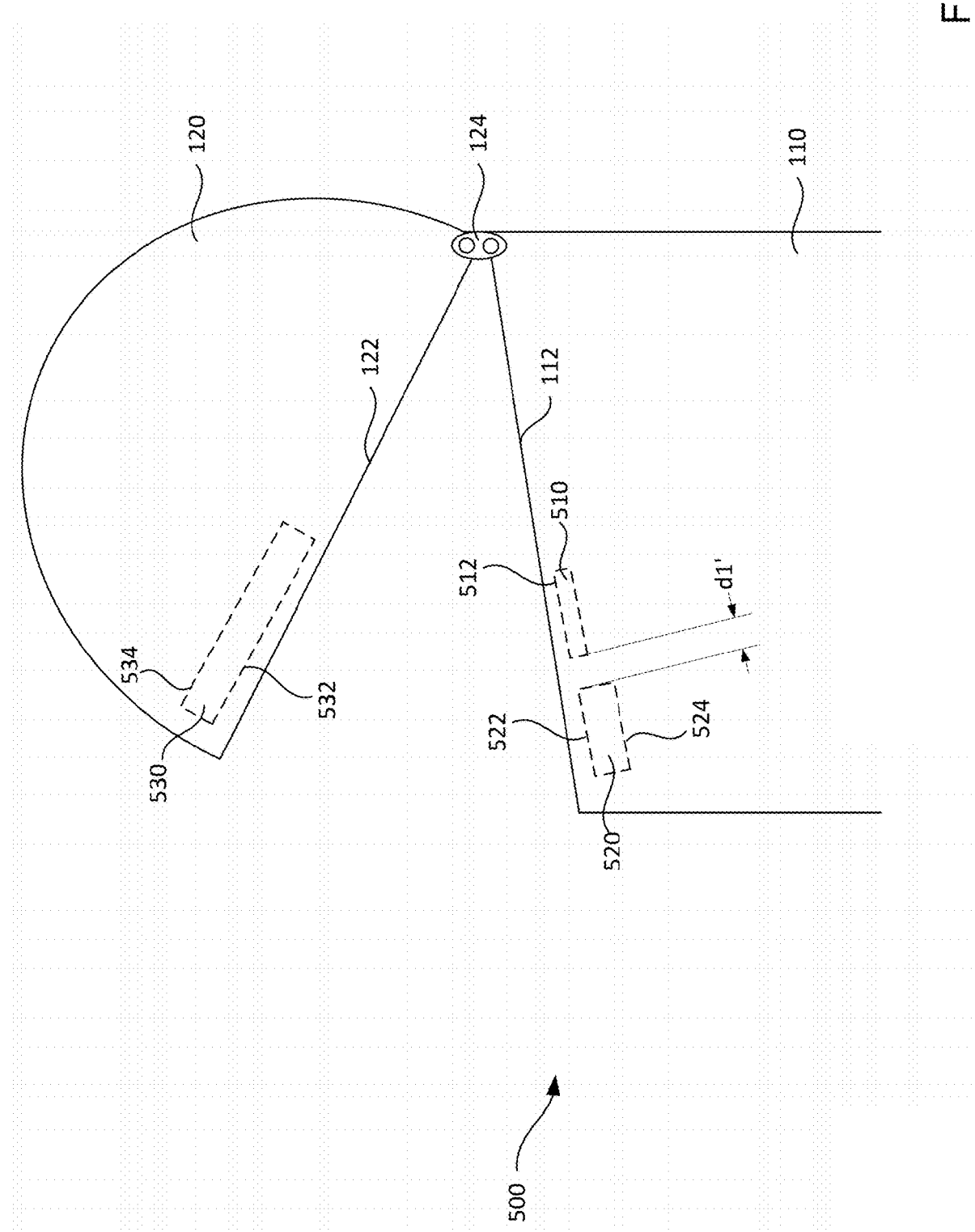
FIGS. 5A and 5B are diagrams illustrating another example magnetic sensing device in accordance with aspects of the disclosure.
Figure 5B:
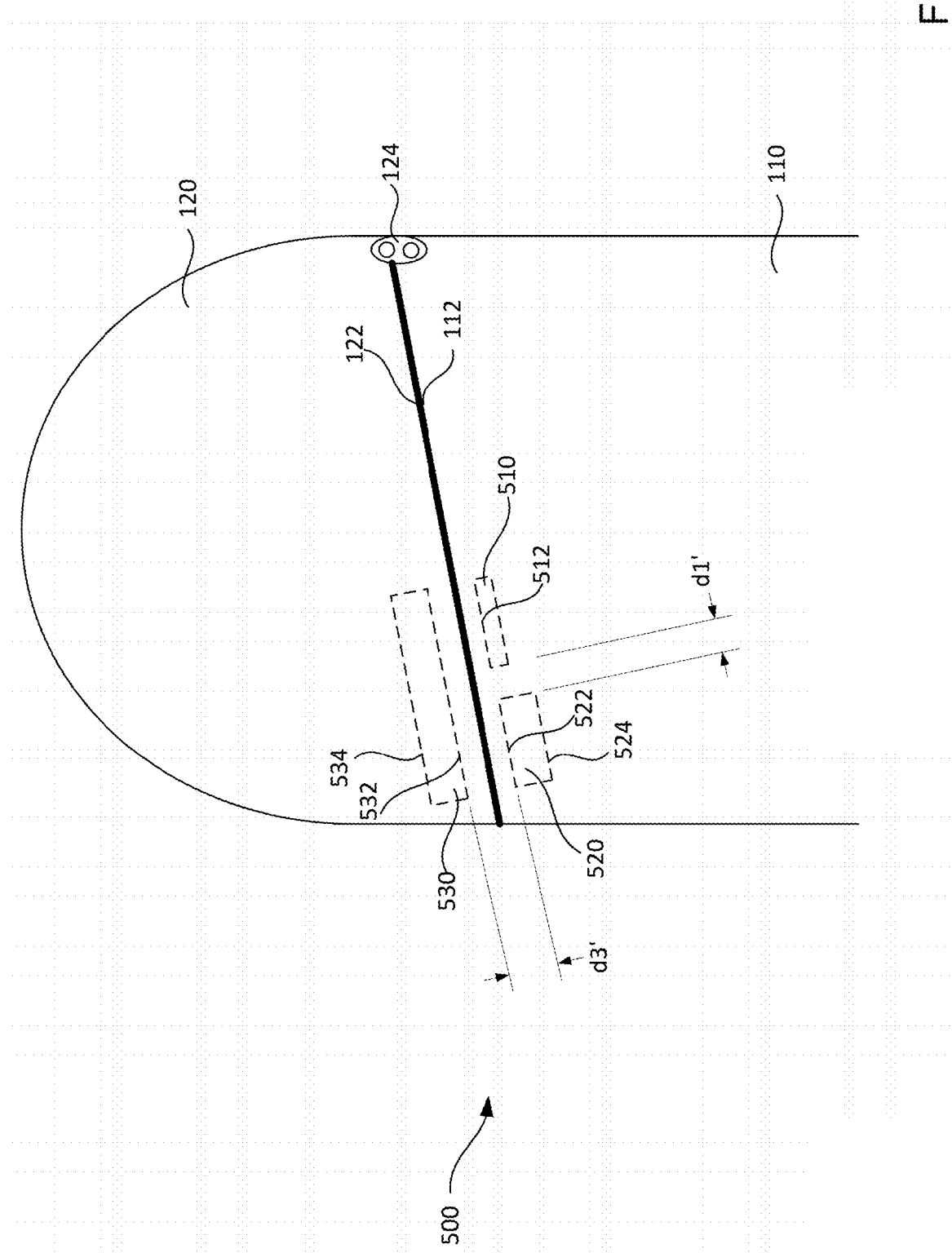
Figure 6A:
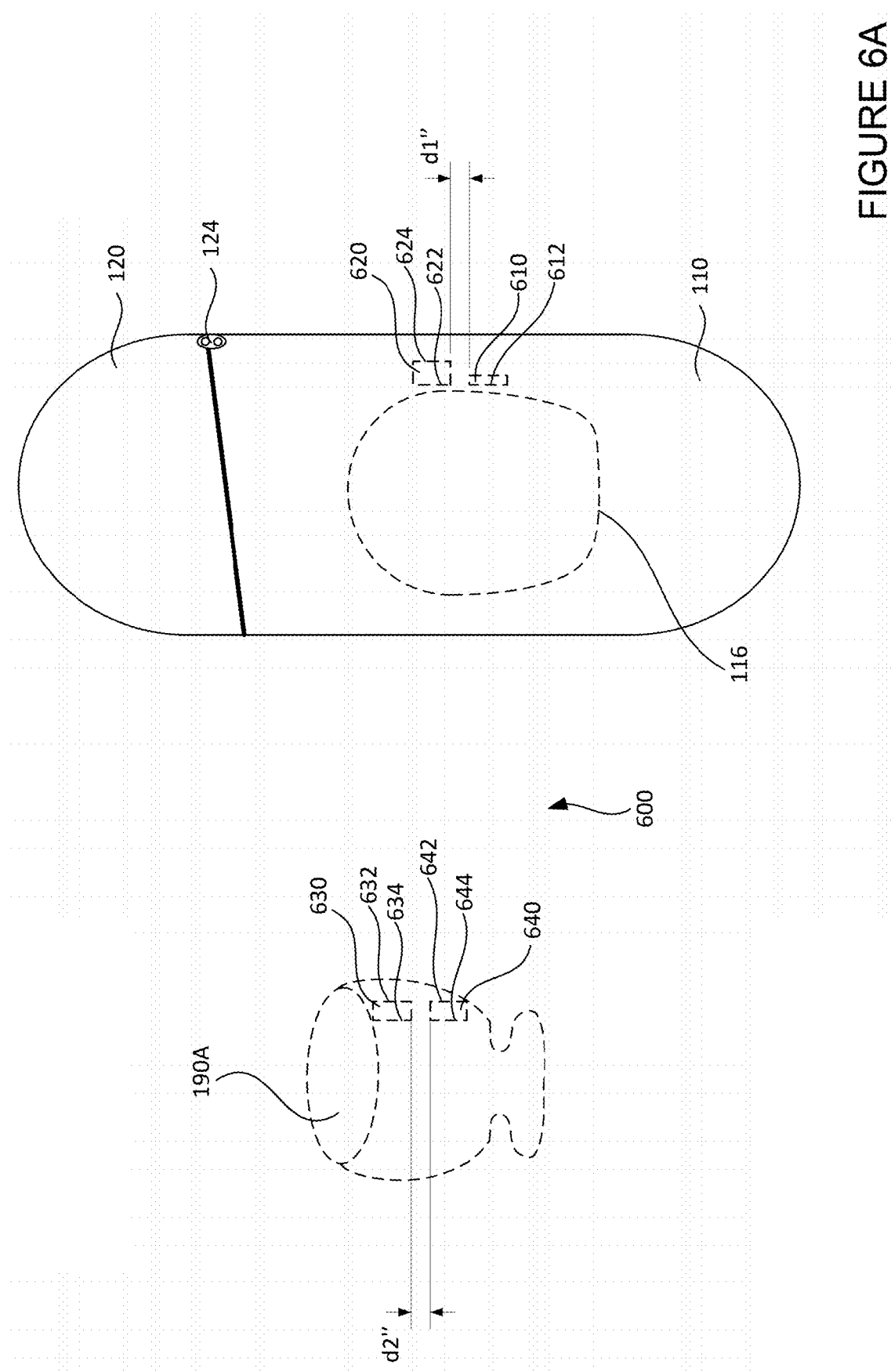
FIGS. 6A and 6B are diagrams illustrating another example magnetic sensing device in accordance with aspects of the disclosure.
Figure 6B:
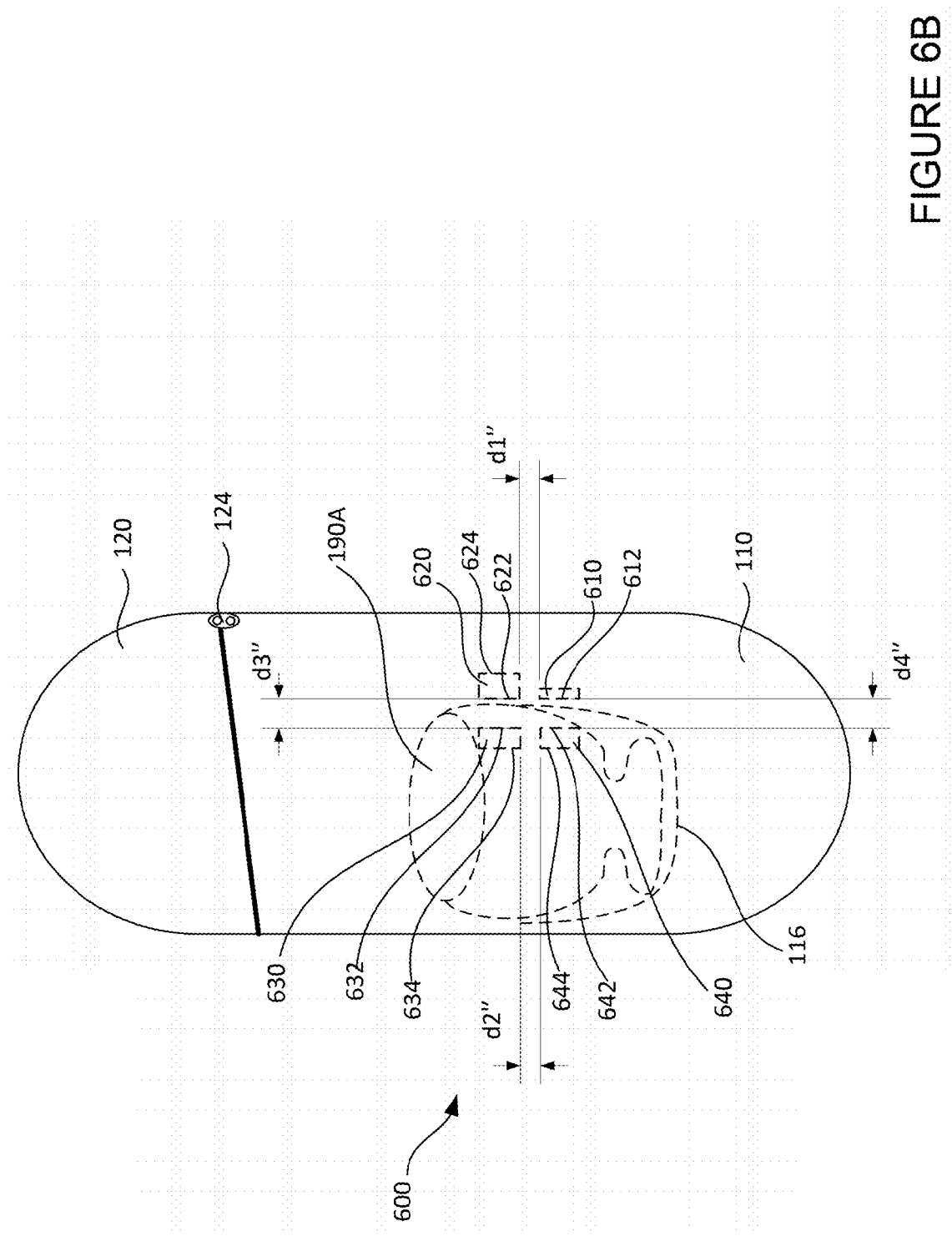

In order to determine the states of the case 100 and/or the state of the earbuds 190, the case 100 includes one or more proximity sensors. For example as shown in FIG. 1B, a first proximity sensor may be a first magnetic sensor 170 for detecting whether the case 100 is open or closed. As such, the case 100 may include one or more magnets (not shown in FIG. 1B, examples are shown in FIGS. 2A, 2B, 5A, 5B) configured to be detected by the first magnetic sensor 170. For another example, a second proximity sensor may be a second magnetic sensor 180 for detecting whether the earbuds 190 are positioned inside the case 100. As such, the case 100 and earbuds 190 may include one or more magnets (not shown in FIG. 1B, examples are shown in FIGS. 6A, 6B) configured to be detected by the second magnetic sensor 180.

Interference between the many magnets of the case 100 described above may cause unreliable detection by the first magnetic sensor 170 and/or the second magnetic sensor 180. As such, magnetic sensors 170 and 180 may not be able to distinguish the magnetic fields from these different magnets in the case 100, and may generate false positives and/or false negatives. For example, the first magnetic sensor 170 may determine that the case 100 is closed based on a detection of a magnetic field from the magnet in the speaker circuitry 162. For another example, the second magnetic sensor 180 may determine that the earbuds 190 are not in the case 100 based on a detection of a magnetic field from the magnets 130 and 140 for holding the body 110 and lid 120 together.

Further, since effects of interference between magnets increase exponentially with decreased distance, interference may be exacerbated by the small dimensions of the case 100. As described above, where the case 100 is configured to house small wireless devices such as earbuds 190 and have dimensions ranging from 5 cm to 10 cm, the various magnets in the case 100 are in close proximity with one another, as well as with the magnetic sensors 170 and 180. Interference may be further exacerbated by one or more magnets in the case 100 that can produce particularly strong magnetic fields. For example, magnets in the charging circuitry 160 (such as wireless charging coil or Qi coil) may be aligned with charging circuitry in the earbuds 190 during charging, and such magnets can produce magnetic fields that are much stronger than the magnetic fields from the other magnets described above. As such, magnetic field from the magnets in the charging circuitry 160 may overpower magnetic field from the other magnets such that outputs of the magnetic sensors 170 and 180 are altered by these magnets.

Figure 2A:
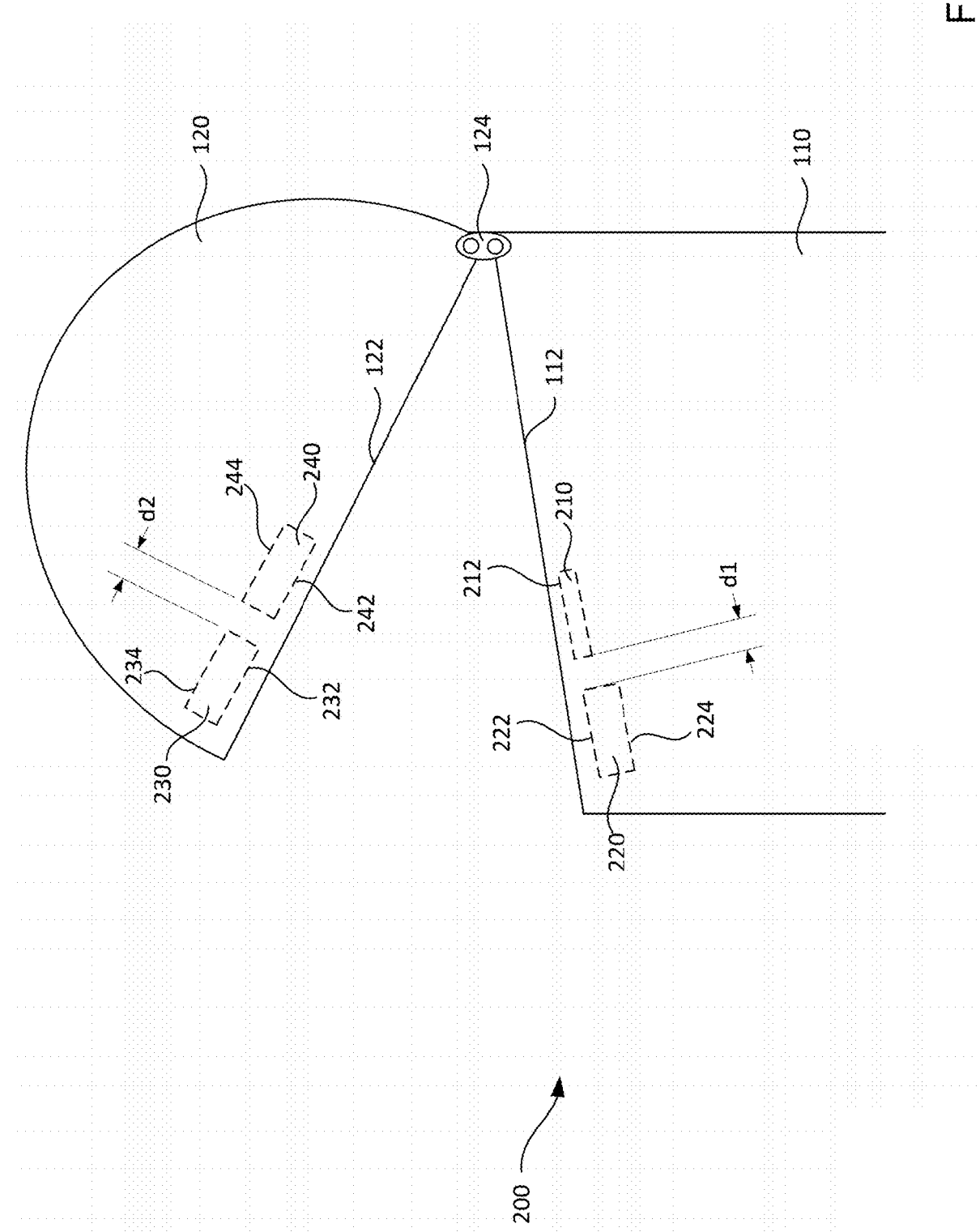

In order to reduce or eliminate effects of such interference on detection of case states, FIGS. 2A and 2B are pictorial diagrams illustrating an example magnetic sensing device 200 for the case 100. FIG. 2A shows relative positions of components of the magnetic sensing device 200 when the case 100 is open. FIG. 2B shows relative positions of components of the magnetic sensing device 200 when the case 100 is closed. As shown, the magnetic sensing device 200 includes a magnetic sensor 210, a first magnet 220, a second magnet 230, and a third magnet 240.

The magnetic sensor 210 may be configured to have low power consumption. For instance, one or more Hall Effect sensors may be selected as the magnetic sensor 210. For example, a Hall Effect sensor may require only 1.5 µA to operate. As described above, after the earbuds 190 are packaged, the earbuds 190 may stay in a shipping mode for months before reaching the user. During this extended period of time, the magnetic sensor 210 must be turned on at all times to monitor whether the case 100 is being opened. As such, by having lower power consumption, the magnetic sensor 210 is not likely to deplete charges in the case 100 during this extended period of time. This ensures that the magnetic sensor 210 does not turn off before reaching the user, and that the case 100 can charge the earbuds 190 to turn off shipping mode, when the case 100 is finally opened by the user.

The magnetic sensor 210 may be configured to be durable. For instance, a Hall Effect sensor may have minimum aging effects, such as having little or minimal sensitivity variations even after being used for an extended period of time. Further, the magnetic sensor 210 may be positioned inside the case 100 such that the magnetic sensor 210 has no exposed parts, which may further protect the magnetic sensor 210 from damage. For example, the magnetic sensor 210 may be positioned inside the space enclosed by the body 110 and the cover layer 114 of the case 100 shown in FIG. 1A. In addition, such a concealed design may improve appearance of the case 100.

The magnetic sensor 210 may be configured to generate a plurality of outputs based on detection of magnetic field. For example, the magnetic sensor 210 may be configured to generate a first output triggered by a detection of magnetic field in a first polarity, and to generate a second output triggered by a detection of magnetic field in a second polarity. For example, the magnetic sensor 210 may be a dual output unipolar Hall Effect sensor. For another example, the magnetic sensor 210 may be configured to include two unipolar Hall Effect sensors. A unipolar Hall Effect sensor responds to magnetic field of a single polarity (such as either North or South). For instance, if a unipolar Hall Effect sensor is configured to respond to the North pole, the unipolar Hall Effect sensor may output one value when detecting a magnetic field with a North polarity, and may output another value when the magnetic field with the North polarity is removed or reverses polarity to South. As such, the magnetic sensor 210 may be configured to generate two outputs, a first output based on the detection of magnetic field in the first polarity, and a second output based on the detection of magnetic field in the second polarity.

Figure 3A:
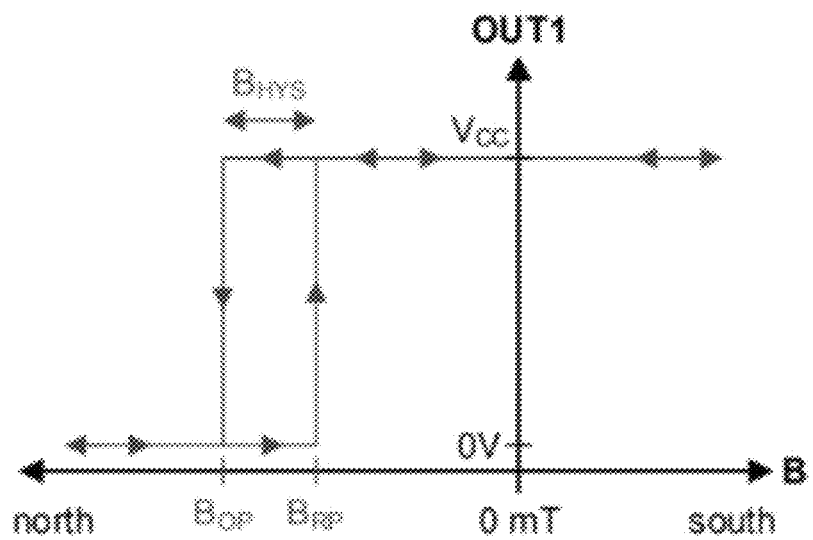
FIGS. 3A and 3B are graphs illustrating operations of an example magnetic sensor in the example magnetic sensing device of FIGS. 2A and 2B in accordance with aspects of the disclosure.
Figure 3B:
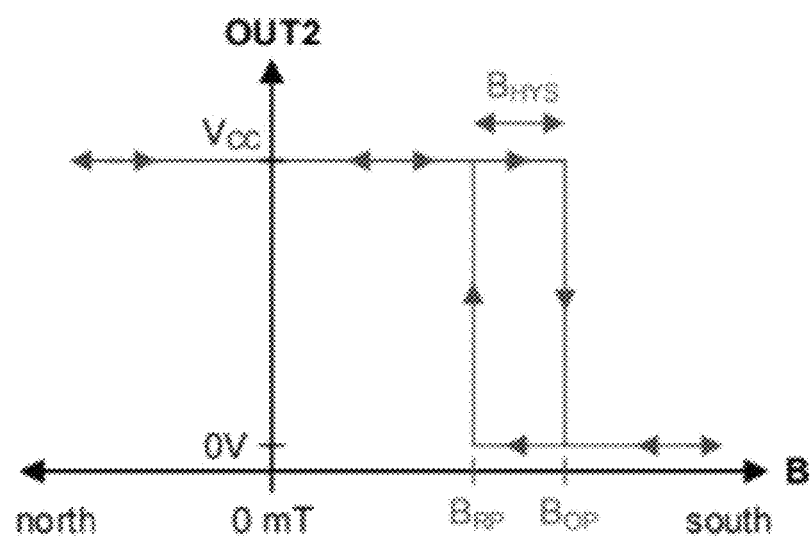

FIGS. 3A and 3B are graphs illustrating example operations of the magnetic sensor 210 in accordance with aspects of the disclosure. FIG. 3A shows an example first output of the magnetic sensor 210. FIG. 3B shows an example second output of the magnetic sensor 210. The first and second outputs of the magnetic sensor 210 may be configured or converted into binary signals. For example, outputs of the magnetic sensor 210 that are high voltage signals ("VCC") may be configured as a logic "1," while outputs of the magnetic sensor 210 that are low voltage signals ("0V") may be configured as a logic "0." As such, the magnetic sensor 210 may send the outputs to the processors 164, which may determine whether the case 100 is open or closed based on the outputs.

Referring to FIG. 3A, the first output of the magnetic sensor 210 is generated based on detecting a magnetic field of a first polarity. In the example shown, the first polarity is North. For instance, initially, the magnetic sensor 210 may detect a magnetic field having a South polarity and generate the high voltage signal VCC as the first output. As the magnetic field decreases in magnitude and eventually switches polarity to North, the first output may initially still be the high voltage signal VCC. However, when the magnitude of the magnetic field eventually reaches an operating point ("BOP") of the magnetic sensor 210 with a North polarity, the magnetic field triggers the magnetic sensor 210 to "operate" and generate the low voltage signal 0V as the first output.

Further as shown, due to hysteresis, a magnetic field of a different magnitude may be required for magnetic sensor 210 to change the first output from the low voltage signal 0V back to the high voltage signal VCC. For instance, in the reversed direction, the magnetic field may decrease from BOP with a North polarity, but the first output does not immediately switch from the low voltage signal 0V to the high voltage signal VCC. Rather, not until the magnetic field drops to a release point ("BRP") of the magnetic sensor 210 does the magnetic field trigger the magnetic sensor 210 to "release" and generate the high voltage signal VCC as the first output.

Referring to FIG. 3B, the second output of the magnetic sensor 210 is generated based on detecting a magnetic field of a second polarity. In the example shown, the second polarity is South. For instance, initially, the magnetic sensor 210 may detect a magnetic field having a North polarity and generate the high voltage signal VCC as the second output. As the magnetic field decreases in magnitude and switches polarity to South, the second output may initially still be the high voltage signal VCC. However, when the magnitude of the magnetic field eventually reaches an operating point BOP of the magnetic sensor 210 with a South polarity, the magnetic field triggers the magnetic sensor 210 to "operate" and generate the low voltage signal 0V as the second output.

Further as shown, due to hysteresis, a magnetic field of a different magnitude may be required for magnetic sensor 210 to change the second output from the low voltage signal 0V to the high voltage signal VCC. For instance, in the reversed direction, the magnetic field may decrease from BOP with a South polarity, but the second output does not immediately switch from the low voltage signal 0V to the high voltage signal VCC. Rather, not until the magnetic field drops to a release point BRP of the magnetic sensor 210 does the magnetic field trigger the magnetic sensor 210 to "release" and generate the high voltage signal VCC as the second output.

Returning to FIG. 2A, the magnetic sensor 210 and the first magnet 220 are positioned inside the body 110 of the case 100. The magnetic sensor 210 may be positioned such that a sensing surface 212 of the magnetic sensor 210 is facing towards the lid 120. The first magnet 220 may be positioned such that a first pole 222 of the first magnet 220 is facing towards the lid 120. The first magnet 220 may have one or more additional poles, such as a second pole 224 facing away from the lid 120. The magnetic sensor 210 and the first magnet 220 are further positioned such that the magnetic sensor 210 and first magnet 220 share the same plane, and the first pole 222 and the magnetic sensor 210 normal direction are at the same direction.

Further as shown in FIG. 2A, the second magnet 230 and the third magnet 240 are positioned inside the lid 120 of the case 100. The second magnet 230 may be positioned such that a first pole 232 of the second magnet 230 is facing towards the body 110. Likewise, the third magnet 240 may also be configured such that a first pole 242 of the third magnet 240 is facing towards the body 110. The second magnet 230 and the third magnet 240 may each have one or more additional poles. For example, the second magnet 230 may have a second pole 234 facing away from the body 110, and the third magnet 240 may have a third pole 244 facing away from the body 110.

In order to protect the magnets, each of the first magnet 220, second magnet 230, and third magnet 240 may be positioned in the case 100 so that they do not have any exposed parts. For example, the first magnet 220 may be embedded in the edge 112 of the body 110, while the second magnet 230 and the third magnet 240 may be embedded in the edge 122 of the lid 120.

Referring to FIG. 2B, the first magnet 220 and the second magnet 230 may be positioned such that, when the case 100 is closed, the first pole 222 of the first magnet 220 is facing the first pole 232 of the second magnet 230. Further, when the case 100 is closed, the first pole 232 of the second magnet 230 may be at a predetermined distance d3 from the first pole 222 of the first magnet 220. The first pole 222 of the first magnet 220 may have a first polarity, while the first pole 232 of the second magnet 230 may have a second polarity opposite to the first polarity. For example, the first polarity may be North while the second polarity may be South. As such, when the case 100 is closed, a magnetic attraction force between the first pole 222 of the first magnet 220 and the first pole 232 of the second magnet 230 may hold the lid 120 to the body 110.

Further as shown in FIG. 2B, the third magnet 240 and the magnetic sensor 210 may be positioned such that, when the case 100 is closed, the first pole 242 of the third magnet 240 is facing the sensing surface 212 of the magnetic sensor 210. Further, when the case 100 is closed, the first pole 242 of the third magnet 240 may be at a predetermined distance d4 from the sensing surface 212 of the magnetic sensor 210. Like the second magnet 230, the first pole 242 of the third magnet 240 may also have a polarity opposite to the first pole 222 of the first magnet 220. Continuing from the example above, the first pole 242 of the third magnet 240 may have the second polarity of South.

Although each of the first magnet 220, second magnet 230, and third magnet 240 are shown as having the same shapes and dimensions, alternatively the first magnet 220, second magnet 230, and third magnet 240 may have different shapes and/or dimensions. For example, for better pairing, the first magnet 220 and the second magnet 230 may be configured to have same shapes and dimensions, while the third magnet 240 and the magnetic sensor 210 may be configured to have same shapes and dimensions, but the first magnet 220 and the third magnet 240 may have different shapes or dimensions, etc. For a case with dimensions in the range of 5 cm-10 cm, each of the first magnet 220, second magnet 230, and third magnet 240 may have dimensions ranging from 1 mm-5 mm. Each of the first magnet 220, second magnet 230, and third magnet 240 may have any of a number of shapes, such as rectangular or cylindrical. Further, each of the first magnet 220, second magnet 230, and third magnet 240 may be any of a number types of magnets, such as a ferromagnet, a ferrimagnet, etc.

Figure 4A:
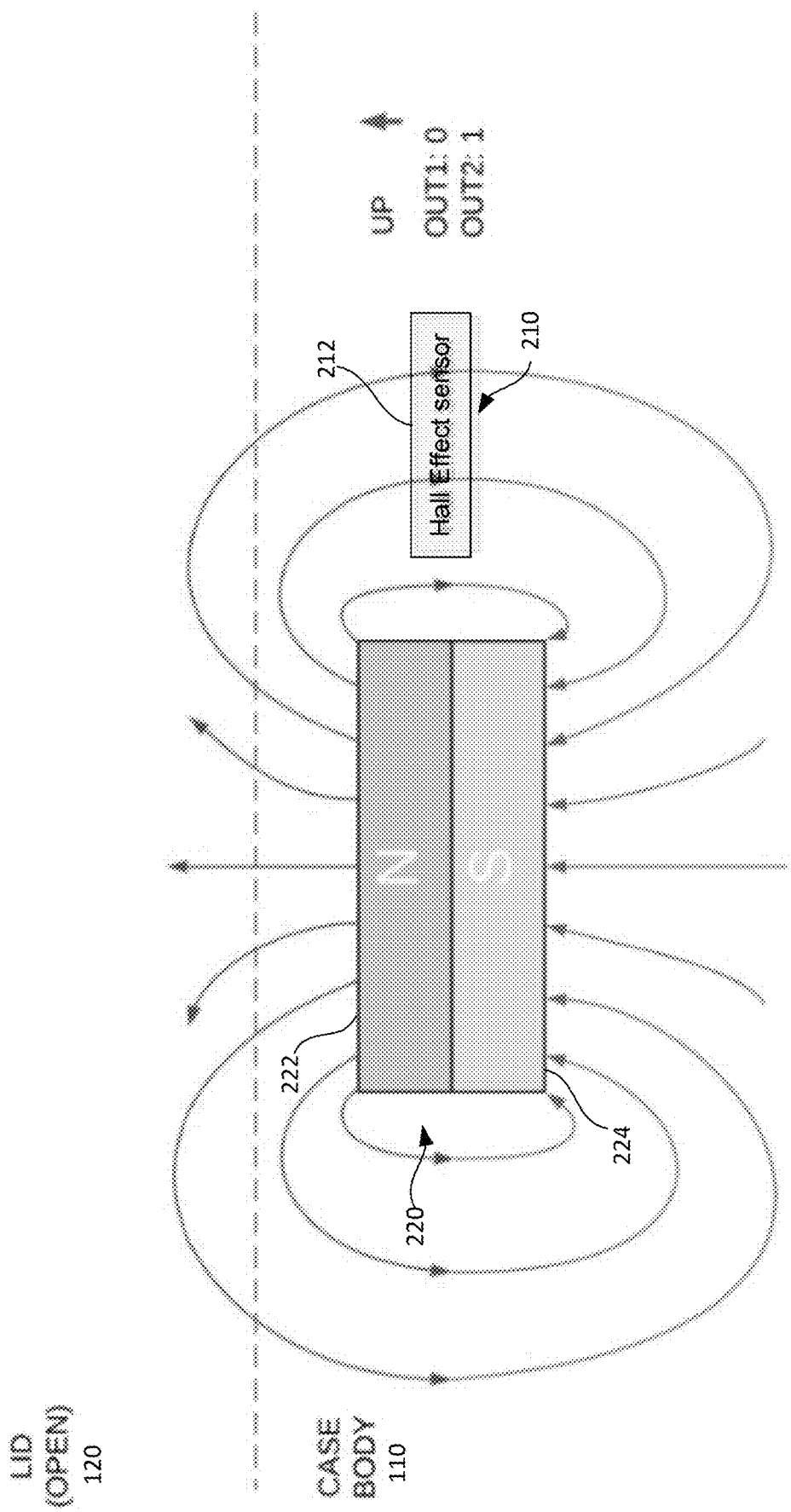
FIGS. 4A and 4B are diagrams illustrating operations of the example magnetic sensing device of FIGS. 2A and 2B in accordance with aspects of the disclosure.
Figure 4B:
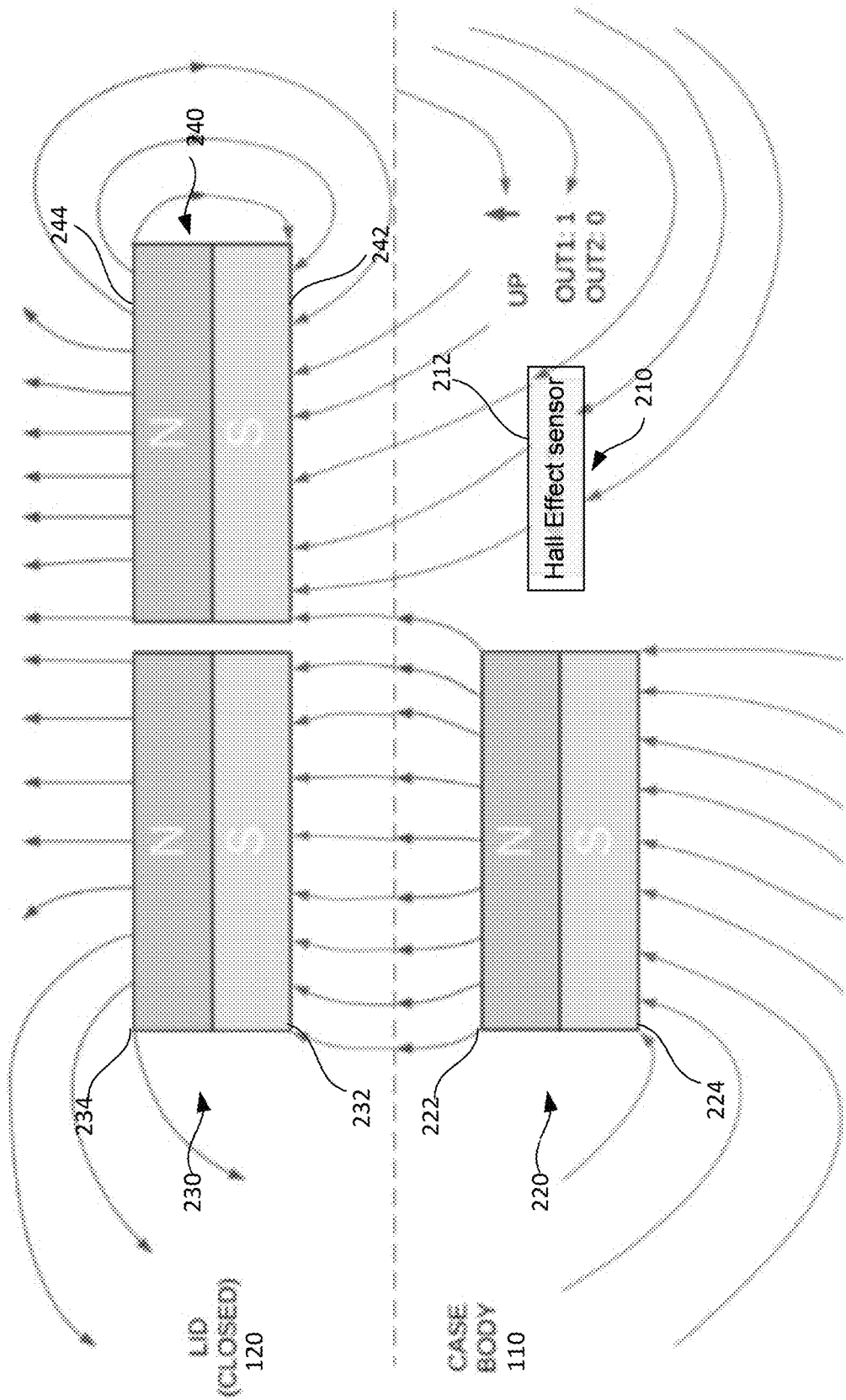

The magnetic sensing device 200 may be configured such that, depending on whether the case 100 is open or closed, a different set of magnets are detectable by the magnetic sensor 210. For instance, when the case 100 is open as shown in FIG. 2A, only the first magnet 220 may be within a distance detectable by the magnetic sensor 210. In contrast, when the case 100 is closed as shown in FIG. 2B, all three magnets 220, 230, and 240 may be within a distance detectable by the magnetic sensor 210. FIGS. 4A and 4B are diagrams illustrating example interactions between the components of magnetic sensing device 200 in accordance with aspects of the disclosure.

FIG. 4A shows example interactions between the magnetic sensor 210 and the first magnet 220 when the case 100 is open. Magnetic flux lines are shown in FIG. 4A to represent magnetic fields. The flux lines indicate the direction (indicated by arrows) of the magnetic force on a North monopole at any given position. As shown, the magnetic force experienced by the magnetic sensor 210 originates from the first pole 222 of the first magnet 220, which in this example is the North pole. The magnetic sensor 210 and the first magnet 220 may be configured such that, when the case 100 is open, magnitude of the magnetic field from the first pole 222 of the first magnet 220 is at or above BOP of the magnetic sensor 210 with a North polarity. As such, the magnetic field from the first pole 222 of the first magnet 220 triggers the magnetic sensor 210 to generate a low voltage signal or logic 0 as the first output (shown as region left of BOP in FIG. 3A). At the same time, the magnetic field from the first pole 222 of the first magnet 220, having a North polarity, does not trigger the magnetic sensor 210 with respect to the second output, thus the second output has a high voltage signal or logic 1 (shown as region left of BRP in FIG. 3B).

In some instances, the magnetic sensor 210 and the first magnet 220 may be configured such that, when the case 100 is open, the magnetic field from the first pole 222 of the first magnet 220 saturates the magnetic sensor 210. For example, the first magnet 220 may be selected to have a magnetic strength such that the first magnet 220 is able to keep the magnetic sensor 210 in deep saturation when the case 100 is closed, but the magnetic strength is not sufficient to damage the magnetic sensor 210. To illustrate, if BOP for the magnetic sensor 210 is 5 mT, and 100 T may damage the magnetic sensor 210, the magnetic strength of the first magnet 220 may be selected to be 10 mT-100 mT, which is much stronger than 5 mT but much weaker than 100 T. Alternatively, the magnetic sensor 210 may be selected to have a BOP such that the first magnet 220 with a fixed magnetic strength is able to keep the magnetic sensor 210 in deep saturation but not sufficient to cause damage. As an example, selecting a magnetic field strength for the first magnet 220 that is twice the BOP may achieve deep saturation for the magnetic sensor 210.

Additionally or alternatively, deep saturation may be achieved by adjusting a distance between the magnetic sensor 210 and the first magnet 220. Referring to FIG. 2A, the predetermined distance d1 may be selected to achieve deep saturation without causing damage to the magnetic sensor 210. For example, the predetermined distance d1 between the magnetic sensor 210 and the first magnet 220 may be adjusted in the range of 1 mm~10 mm.

Maintaining the magnetic sensor 210 in deep saturation reduces or eliminates effect of interference from other magnets in the case 100 or in the surroundings of the case 100. When deeply saturated, it would require a very strong magnetic field with an opposite polarity to reverse one or more outputs of the magnetic sensor 210. In contrast, when not deeply saturated, even weak interference may reverse one or more outputs of the magnetic sensor 210. In this regard, the extent of the deep saturation required may be determined based on an extent of the interference from other magnets in the case 100.

FIG. 4B illustrates example operation interactions between the magnetic sensor 210 and the first magnet 220, second magnet 230, and third magnet 240 when the case 100 is closed. As described above, when the case 100 is closed, the first pole 222 of the first magnet 220 is at the predetermined distance d3 from the first pole 232 of the second magnet 230. As such, the interaction between the first magnet 220 and the second magnet 230 alters the magnetic field detected by the magnetic sensor 210. In particular, because the first pole 222 of the first magnet 220 is opposite in polarity than the first pole 232 of the second magnet 230, the first pole 222 of the first magnet 220 now exerts magnetic attraction force on the first pole 232 of the second magnet 230, rather than to the sensing surface 212 of the magnetic sensor 210. As such, the magnetic sensor 210 no longer detects magnetic field with a North polarity from the first pole 232 of the first magnet 220.

In this regard, the magnetic strength of the first magnet 220 and/or the second magnet 230 may be selected such that, when the case 100 is closed, the second magnet 230 exerts sufficient attraction force to the first magnet 220 so that magnetic field from the first pole 222 of the first magnet 220 is no longer detectable by the magnetic sensor 210. Additionally or alternatively, the predetermined distances d1 and/or d3 may be selected such that, when the case 100 is closed, the second magnet 230 exerts sufficient attraction force to the first magnet 220 so that magnetic field from the first pole 222 of the first magnet 220 is no longer detectable by the magnetic sensor 210. In addition, the magnetic strength of the first magnet 220 and/or the second magnet 230 may be selected so that they may hold the body 110 to the lid 120 with sufficient force to keep the case 100 closed, such as meeting a predetermined threshold holding force. For another example, the first magnet 220 and the second magnet 230 may be selected so that it is not too difficult for a person to separate the lid 120 from the body 110.

As described above, when the case 100 is closed, the first pole 242 of the third magnet 240 is at the predetermined distance d4 from the sensing surface 212 of the magnetic sensor 210. As such, the magnetic field detected by the magnetic sensor 210 originates from the first pole 242 of the third magnet 240, which in this example is the South pole. The magnetic sensor 210 and the third magnet 240 may be configured such that, when the case 100 is closed, magnitude of the magnetic field from the first pole 242 of the third magnet 240 is at or above BOP of the magnetic sensor 210 with a South polarity. As such, the magnetic field from the first pole 242 of the third magnet 240 triggers the magnetic sensor 210 to generate a low voltage signal or logic 0 as the second output (shown as region right of BOP in FIG. 3B). At the same time, the magnetic field from the first pole 242 of the third magnet 240, having a South polarity, does not trigger the magnetic sensor 210 with respect to the first output, thus the first output has a high voltage signal or logic 1 (shown as region right of BRP in FIG. 3A).

A comparison of FIGS. 4A and 4B show that both the first output and the second output of the magnetic sensor 210 are reversed when the case 100 switches from an open to a closed state. This way, the processors 164 may determine whether the case 100 is open or closed based on values of the first output and the second output. For example, when the case 100 is open, the first output and the second output have a first set of values [0, 1]. When the case 100 is closed, the first output and the second output have a second set of values [1, 0].

Further, the magnetic sensor 210 may produce other values for the first output and the second output during transitions between the open state and the closed state of the case 100. For example, when transitioning from open to closed, as the lid 120 is approaching the body 110, there may be a moment when the value for the first output changes from 0 to 1, while the value for the second output is still at 1, resulting in a set of values [1, 1]. For another example, when transitioning from closed to open, as the lid 120 is moving away from the body 110, there may be a moment when the value for the first output changes from 1 to 0, while the value for the second input is still at 0, resulting in a set of values [0, 0]. Such "half states" may provide useful information to indicate transitions in case states, and may be used as advance warning of an upcoming new state for the case.

In some instances, the magnetic sensor 210 and the third magnet 240 may be configured such that, when the case 100 is closed, the magnetic field from the first pole 242 of the third magnet 240 saturates the magnetic sensor 210. For example, the third magnet 240 may be selected to have a magnetic strength such that the third magnet 240 is able to keep the magnetic sensor 210 in deep saturation when the case 100 is closed, but the magnetic strength is not sufficient to damage the magnetic sensor 210. To illustrate, if BOP for the magnetic sensor 210 is 5 mT, and 100 T may damage the magnetic sensor 210, the magnitude of magnetic field from the third magnet 240 may be selected to be 10 mT-100 mT, which is much stronger than 5 mT but much weaker than a damaging field strength.

Further as illustrated by FIGS. 2A-4B, the magnetic strengths of each of the first magnet 220, the second magnet 230, and the third magnet 240 may be selected together based on a number of factors. For instance, the first magnet 220, the second magnet 230, and the third magnet 240 may be selected so that an optimal lid closure force is provided by the first magnet 220 and the second magnet 230 when the case 100 is closed, and so that interactions between the three magnets cause the magnetic sensor 210 to be deeply saturated in the first polarity when the case 100 is open, and cause the magnetic sensor 210 to be deeply saturated in the second polarity when the case 100 is closed.

As described above, keeping the magnetic sensor 210 in deep saturation reduces or eliminates effect of interference from other magnets in the case 100 or in the surroundings of the case 100. When the case 100 is open as shown in FIG. 4A, magnetic field with a North polarity saturates the magnetic sensor 210. When the case is closed as shown in FIG. 4B, magnetic field with a South polarity saturates the magnetic sensor 210. As such, for both open and closed state of the case 100, it would require a very strong magnetic field with an opposite polarity to reverse one or more outputs of the magnetic sensor 210. This ensures that the magnetic sensing device 200 is able to reliably detect whether the case 100 is open or closed despite interference from other magnets in the case 100.

Since the more reliable detection results are achieved by ensuring saturation in both open and closed states by magnetic fields of opposite polarities, it follows that the magnetic sensing device 200 requires at least two magnets. By using the magnets 220 and 230 configured to hold the case 100 closed also for detection of case states, the magnetic sensing device 200 effectively reduces the overall number of magnets needed for the case 100. To illustrate, since two magnets are required to hold the case 100 closed, and two magnets are required to achieve saturation with opposite polarities for accurate detection, this results in at least four magnets to accomplish both purposes. However, as shown in FIGS. 2A and 2B, only three magnets are used in the magnetic sensing device 200 to achieve both purposes. Using fewer magnets may reduce cost of the case 100, as well as reduce complexity in manufacturing and assembly. Further, as the number of magnets increases, the difficulty in aligning the magnets to ensure proper interactions also increases during installation. As such, reducing the number of magnets used may increase efficiency during installation.

In fact, since saturation by two polarities is required, the number of magnets for the magnetic sensing device may be further reduced from three to two. FIGS. 5A and 5B are pictorial diagrams illustrating another example magnetic sensing device 500 for the case 100 with only two magnets. FIG. 5A shows relative positions of components of the magnetic sensing device 500 when the case 100 is open. FIG. 5B shows relative positions of components of the magnetic sensing device 500 when the case 100 is closed. As shown, the magnetic sensing device 500 includes a magnetic sensor 510, a first magnet 520, and a second magnet 530.

Magnetic sensing device 500 may be configured with similar features as magnetic sensing device 200. For example, the magnetic sensor 510 may be configured similarly as the magnetic sensor 210, the first magnet 520 may be configured similarly as the first magnet 220, and the second magnet 530 may be configured similarly as the second magnet 230. For example, the magnetic sensor 510 may be a dual output unipolar Hall Effect sensor with operations as shown in FIGS. 3A and 3B. For another example, the magnetic sensor 510 may include two unipolar Hall Effect sensors with operations respectively shown in FIGS. 3A and 3B. For another instance, a sensing surface 512 of the magnetic sensor 510 and a first pole 522 of the first magnet 520 may be facing towards the lid 120. For another instance, a first pole 532 of the second magnet 530 may be facing towards the body 110. For still another instance, the first pole 522 of the first magnet 520 may have a first polarity (e.g. North), while the first pole 532 of the second magnet 530 may have a second polarity (e.g. South) opposite to the first polarity. For yet another instance, when the case 100 is closed, the first pole 522 of the first magnet 520 may be facing the first pole 532 of the second magnet 530. The first magnet 520 may have a second pole 524 with the second polarity, and the second magnet 530 may have a second pole 534 with the first polarity.

As such, when the case 100 is open, the magnetic sensor 510 and the first magnet 520 interact in a similar way as the magnetic sensor 210 and the first magnet 220 as shown in FIG. 4A. The magnetic sensor 510 and the first magnet 520 may be configured such that, when the case 100 is open, magnitude of the magnetic field from the first pole 522 of the first magnet 520 is at or above BOP of the magnetic sensor 510 with a North polarity. As such, the magnetic field from the first pole 522 of the first magnet 520 triggers the magnetic sensor 510 to generate a low voltage signal or logic 0 as the first output (shown as region left of BOP in FIG. 3A). At the same time, the magnetic field from the first pole 522 of the first magnet 520, having a North polarity, does not trigger the magnetic sensor 510 with respect to the second output, thus the second output has a high voltage signal or logic 1 (shown as region left of BRP in FIG. 3B).

Further as discussed above, the magnetic sensor 510 and the first magnet 520 may be configured such that, when the case 100 is open, the magnetic field from the first pole 522 of the first magnet 520 saturates the magnetic sensor 510. In this regard, a magnetic strength of the first magnet 520, BOP of the magnetic sensor 510, and/or a predetermined distance d1' between the first magnet 520 and the magnetic sensor 510 may be adjusted.

However, as shown in FIG. 5B, when the case 100 is closed, the second magnet 530 extends across both the first magnet 520 and the magnetic sensor 510. As such, the first pole 532 of the second magnet 530 is facing both the first pole 522 of the first magnet 520 and the sensing surface 512 of the magnetic sensor 510. In this configuration, the second magnet 530 engage both the first magnet 520 and the magnetic sensor when the case 100 is closed. In some examples, the second magnet 530 may be made by combining two magnets, such as combining the second magnet 230 and the third magnet 240 to form a larger magnet.

As such, when the case 100 is closed, the magnetic sensor 510 and the second magnet 530 also interact in a similar way as the magnetic sensor 210 with the second magnet 230 and third magnet 240 as shown in FIG. 4B. In that regard, the second magnet 530 may be considered as having two portions, a first portion facing the first pole 522 of the first magnet 520, and a second portion facing the sensing surface 512 of the magnetic sensor 510. When the case 100 is closed, the first pole 522 of the first magnet 520 is at a predetermined distance d3' from the first pole 532 of the second magnet 530. As such, the interaction between the first magnet 520 and the second magnet 530 alters the magnetic field detected by the magnetic sensor 510. In particular, because the first pole 522 of the first magnet 520 is opposite in polarity than the first pole 532 of the second magnet, the first pole 522 of the first magnet 520 now exerts magnetic attraction force to the first pole 532 of the second magnet 530, rather than to the sensing surface 512 of the magnetic sensor 510. As such, the magnetic sensor 510 no longer detects magnetic field with a North polarity from the first pole 522 of the first magnet 520.

Rather, since the first pole 532 of the second magnet 530 is at the predetermined distance d3' from the sensing surface 512 of the magnetic sensor 510, the magnetic field detected by the magnetic sensor 510 originates from the first pole 532 of the second magnet 530, which in this example is the South pole. The magnetic sensor 510 and the second magnet 530 may be configured such that, when the case 100 is closed, magnitude of the magnetic field from the first pole 532 of the second magnet 530 is at or above BOP of the magnetic sensor 510 with a South polarity. As such, the magnetic field from the first pole 532 of the second magnet 530 triggers the magnetic sensor 510 to generate a low voltage signal or logic 0 as the second output (shown as region right of BOP in FIG. 3B). At the same time, the magnetic field from the first pole 532 of the second magnet 530, having a South polarity, does not trigger the magnetic sensor 510 with respect to the first output, thus the first output has a high voltage signal or logic 1 (shown as region right of BRP in FIG. 3A).

Further as discussed above, the magnetic sensor 510 and the second magnet 530 may be configured such that, when the case 100 is closed, the magnetic field from the first pole 532 of the second magnet 530 saturates the magnetic sensor 510. In this regard, a magnetic strength of the second magnet 530, BOP of the magnetic sensor 510, and/or the predetermined distance d3' between the second magnet 530 and the first magnet 520 may be adjusted. In addition, the magnetic strength of the first magnet 520 and/or the second magnet 530 may be selected so that they may hold the body 110 to the lid 120 with sufficient force to keep the case 100 closed.

In another aspect, magnetic sensing device 200 or 500 may be positioned inside the earbuds 190 and the case 100 in order to detect a state of the earbuds 190, such as whether the earbuds 190 are positioned inside the case 100. FIGS. 6A and 6B are pictorial diagrams illustrating an example magnetic sensing device 600 for the earbuds 190 and case 100. In some instances, since there are two earbuds 190, one magnetic sensing device 600 may be provided for detecting each earbud. However, for ease of illustration, FIGS. 6A and 6B only illustrate with respect to one earbud 190A of the two earbuds 190. FIG. 6A shows relative positions of components of the magnetic sensing device 600 when the earbud 190A is not positioned inside the case 100. FIG. 6B shows relative positions of components of the magnetic sensing device 600 when the earbud 190A is positioned inside the case 100.

As shown in FIGS. 6A and 6B, magnetic sensing device 600 may include a magnetic sensor 610, a first magnet 620, a second magnet 630, and a third magnet 640. As shown, the magnetic sensing device 600 is configured similarly as magnetic sensing device 200. For example, the magnetic sensor 610 may be configured similarly as the magnetic sensor 210, the first magnet 620 may be configured similarly as the first magnet 220, the second magnet 630 may be configured similarly as the second magnet 230, and the third magnet 640 may be configured similarly as the third magnet 240. As such, elements of the magnetic sensing device 600 are labeled with reference numbers corresponding to reference numbers for magnetic sensing device 200. For example, the sensing surface 612 of the magnetic sensor 610 corresponds to the sensing surface 212 of the magnetic sensor 210; the first pole 622 of the first magnet 620 corresponds to the first pole 222 of the first magnet 220; the second pole 624 of the first magnet 620 corresponds to the second pole 224 of the first magnet 224, and so on.

In contrast, as shown in FIG. 6A, the magnetic sensor 610 and the first magnet 620 may be positioned inside the case 100 near or at the grooves 116, whereas the second magnet 630 and third magnet 640 may be positioned inside the earbud 190A. The relative positions of the magnetic sensor 610, first magnet 620, second magnet 630, and third magnet 640 may be adjusted such that, when the earbud 190A is not positioned inside the case 100, the magnetic sensor 610 may generate the first output and the second output based on magnetic field from the first magnet 620, similar to the descriptions above for FIG. 4A. Likewise, the relative positions of the magnetic sensor 610, first magnet 620, second magnet 630, and third magnet 640 may be adjusted such that, when the earbud 190A is positioned inside the case 100, the magnetic sensor 610 may generate the first output and the second output based on magnetic field from the third magnet 640, similar to the descriptions above for FIG. 4B.

Further as discussed above, the magnetic sensor 610 and the first magnet 620 may be configured such that, when the earbud 190A is not inside the case 100, the magnetic field from a first pole 622 of the first magnet 620 saturates the magnetic sensor 610. In this regard, a magnetic strength of the first magnet 620, BOP of the magnetic sensor 610, and/or a predetermined distance d1" between the first magnet 620 and the magnetic sensor 610 may be adjusted.

Also as discussed above, the magnetic sensor 610, the second magnet 630, and the third magnet 640 may be configured such that, when the case 100 is closed, the magnetic field from the first pole 642 of the third magnet 640 saturates the magnetic sensor 610. In this regard, a magnetic strength of the second magnet 630, a magnetic strength of the third magnet 640, BOP of the magnetic sensor 610, and/or the predetermined distances d2", d3", and d4" may be adjusted.

In addition, the magnetic strength of the first magnet 620 and/or the second magnet 630 may be selected so that they may hold the earbud 190A in the grooves 116 and/or align the earbud 190A for charging. By using the magnets 620 and 630 configured to hold and/or align earbud 190A also for detection of earbud states, the magnetic sensing device 600 effectively reduces the overall number of magnets needed for the case 100. To illustrate, since two magnets are required to hold and/or align the earbud 190A, and two magnets are required to achieve saturation with opposite polarities for accurate detection, this results in at least four magnets to accomplish both purposes. However, as shown in FIGS. 6A and 6B, only three magnets are used in the magnetic sensing device 600 to achieve both purposes. Using fewer magnets may reduce cost of the case 100, as well as reduce complexity in manufacturing and assembly.

Although FIGS. 6A and 6B show the magnetic sensor 610 and the first magnet 620 as positioned inside the case, alternatively the magnetic sensor 610 and the first magnet 620 may be positioned inside the earbud 190A. In that instance, the second magnet 630 and the third magnet 640 may then be positioned inside the case 100. As such, the magnetic sensing device 600 may send outputs to the processors of the earbud 190A. For instance, the processors of the earbud 190A may then determine whether the earbud 190A is positioned inside the case 100, and determine whether to initiate any of a number of functions, such as communicating with the case 100 or sending audio signals to the case 100 to be broadcasted.

Figure 7:
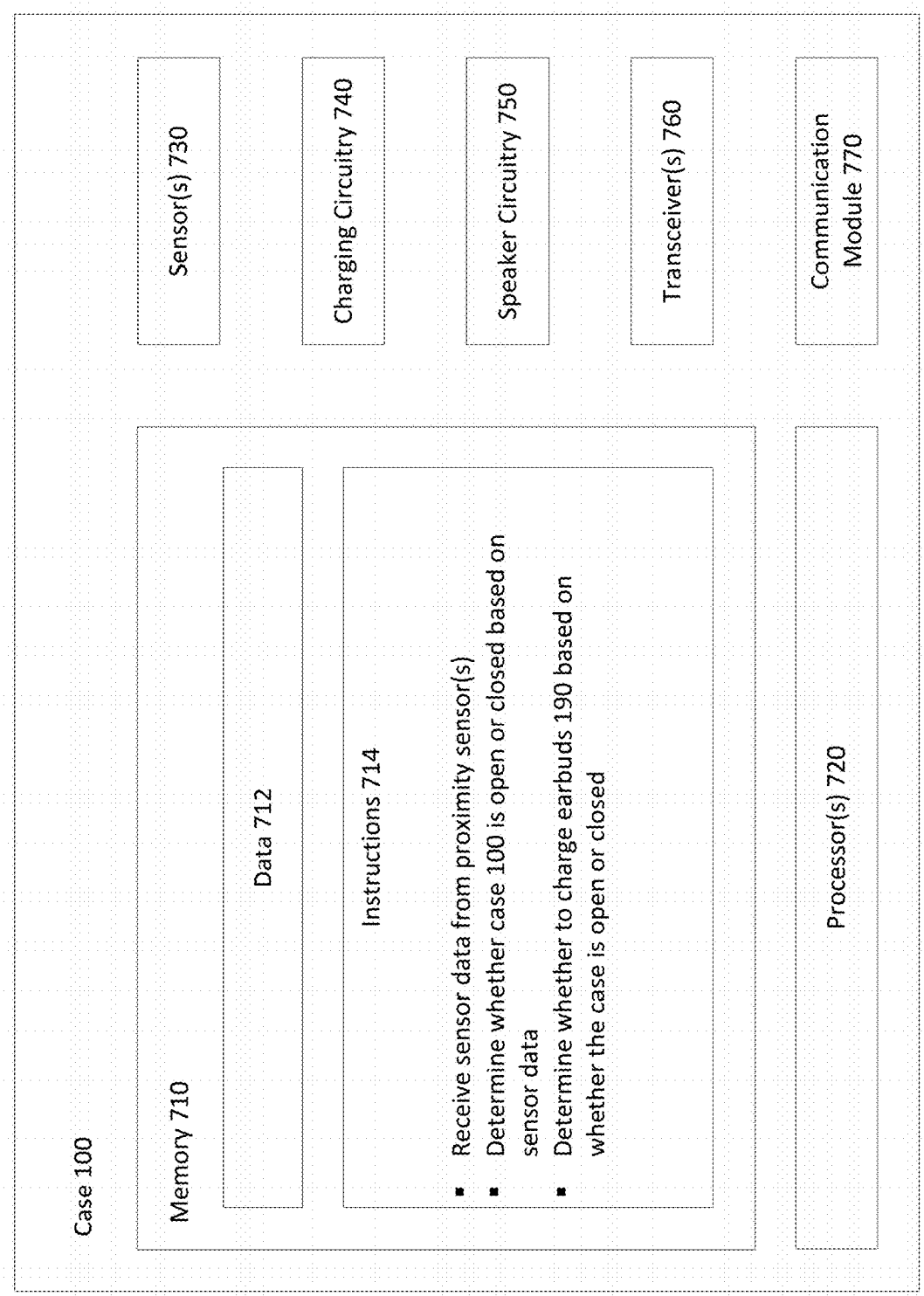
FIG. 7 is a block diagram of an example system in accordance with aspects of the disclosure.

FIG. 7 shows an example block diagram of the case 100. The case 100 may include one or more memories 710, processors 720, as well as other components. For example, the case 100 may further include sensor(s) 730, charging circuitry 740, speaker circuitry 750, one or more transceivers 760, and communication module 770. The case 100 may further include a user interface and one or more internal clocks.

The case 100 may include some or all of the features of the case 100 in FIGS. 1A, 1B, 2A, 2B, 5A, 5B, 6A, and 6B. For example, the sensor(s) 730 may include a proximity sensor for detecting whether the case 100 is open or closed, such as the magnetic sensing device 200 or 500. For another example, the sensor(s) 730 may include a proximity sensor for detecting whether the earbuds 190 are positioned inside the case 100, such as the magnetic sensing device 600. Further, the charging circuitry 740 may be configured as charging circuitry 160 for charging earbuds 190 as shown in FIG. 1B. The speaker circuitry 750 may be configured as speaker circuitry 162 for broadcasting audio received from earbuds 190 as shown in FIG. 1B. The transceivers 760 may be configured to communicate with the earbuds 190, such as for requesting and receiving battery life information from earbuds 190.

The memory 710 may store information accessible by the one or more processors 720, including data 712 instructions 714 that may be executed or otherwise used by the one or more processors 720. For example, memory 710 may be of any type capable of storing information accessible by the processor(s) 720, including a computing device-readable medium, or other medium that stores data that may be read with the aid of an electronic device, such as a volatile memory, nonvolatile as well as other write-capable and read-only memories. By way of example only, memory 710 may be a static random-access memory (SRAM) configured to provide fast lookups. Systems and methods may include different combinations of the foregoing, whereby different portions of the instructions and data are stored on different types of media.

The data 712 may be retrieved, stored or modified by the one or more processors 720 in accordance with the instructions 714. For instance, data 712 may include detection data from the sensors 730, which may indicate whether the case 100 is open or closed, or whether a wireless device is detected inside the case 100. The data 712 may also include data received through the one or more transceivers 760, such as battery life information of the wireless device positioned inside the case 100. In accordance with the instructions 712, the one or more processors 720 may control the sensors 730, the charging circuitry 740, the speaker circuitry 750, and the transceivers 760 based on the data 712. Although the claimed subject matter is not limited by any particular data structure, the data may be stored in computing device registers, in a relational database as a table having a plurality of different fields and records, XML documents or flat files. The data may also be formatted in any computing device-readable format.

The instructions 714 may be any set of instructions to be executed directly (such as machine code) or indirectly (such as scripts) by the one or more processors 720. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance.

The one or more processors 720 may be microprocessors, logic circuitry (e.g., logic gates, flip-flops, etc.) hard-wired into the case 100, or may be a dedicated application specific integrated circuit (ASIC). It should be understood that the one or more processors 720 are not limited to hard-wired logic circuitry, but may also include any commercially available processing unit, or any hardware-based processors, such as a field programmable gate array (FPGA). In some examples, the one or more processors 720 may include a state machine.

The one or more sensors 730 may include any of a variety of mechanical or electromechanical sensors, such as a proximity sensor, an accelerometer, gyroscope, magnetic sensor, switch, light sensor, barometer, audio sensor (e.g., microphone), vibration sensor, heat sensor, radio frequency (RF) sensor, etc. In this regard, the one or more processors 720 and memory 710 of the case 100 may receive detection data from any of these sensors 730.

The communication module 770 may include a wireless network connection module, a wireless ad hoc connection module, and/or a wired connection module. The wireless network connection module may be configured to support communication via cellular, LTE, 4G, WiFi, GPS, and other networked architectures. The wireless ad hoc connection module may be configured to support Bluetooth®, Bluetooth LE, near field communications, and other non-networked wireless arrangements. And the wired connection may include a USB, micro USB, USB type C or other connector, for example to receive data and/or power from a laptop, tablet, smartphone or other device. For instance, using the communication module 770, the case 100 may communicate wirelessly with earbuds 190, such as via Bluetooth® pairing.

The technology is advantageous because it provides reliable proximity detection since each state of the case may cause the magnetic sensor to be triggered by a different polarity. Configurations that cause deep saturation of the magnetic sensor may further reduce or eliminate effects of interference from other magnetic components, thereby improving detection reliability. By improving detection reliability, the technology may improve out of box experience for wireless devices without risking violating regulations or wasting energy. The improved detection reliability may also conserve energy during later use, since the case may determine whether to perform various functions based on the state of the case and/or the state of the wireless devices. Features of the technology further provides for reducing the number of magnets required by configuring one or more magnets in the magnetic sensing device for performing multiple functions, which may reduce cost of manufacturing.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A device, comprising:
a magnetic sensor, wherein a first output of the magnetic sensor is triggered by magnetic fields having a first polarity and a second output of the magnetic sensor is triggered by magnetic fields having a second polarity;
a first magnet; and
a second magnet, the second magnet being positioned at an adjustable distance from the first magnet;
wherein a strength of the first magnet or a distance between the first magnet and the magnetic sensor is selected such that when the second magnet is not within a predetermined distance from the first magnet, a magnetic field from the first magnet having the first polarity causes the first output and the second output to have a first set of values, and a magnetic field from a pole of the first magnet having the first polarity saturates the magnetic sensor.

2. The device of claim 1, further comprising a third magnet, the third magnet being positioned at an adjustable distance from the magnetic sensor,
wherein, when the second magnet is within the predetermined distance from the first magnet, a magnetic field from the third magnet having the second polarity causes the first output and the second output to have a second set of values.

3. The device if claim 1, wherein the first magnet is positioned at a fixed distance from the magnetic sensor.

4. The device of claim 1, wherein, when the second magnet is within the predetermined distance from the first magnet, a pole of the first magnet having the first polarity is configured to be facing a pole of the second magnet having the second polarity.

5. The device of claim 1, wherein, when the second magnet is within the predetermined distance from the first magnet, a pole of the third magnet having the second polarity is configured to be facing a sensing surface of the magnetic sensor.

6. The device of claim 1, wherein, when the second magnet is within the predetermined distance from the first magnet, a magnetic field from a pole of the third magnet having the second polarity saturates the magnetic sensor.

7. The device of claim 1, wherein a strength of the third magnet is selected based on an operating point of the magnetic sensor or a distance between the second magnet and the third magnet is selected such that, when the second magnet is within the predetermined distance from the first magnet, a magnetic field from a pole of the third magnet having the second polarity saturates the magnetic sensor.

8. The device of claim 1, wherein a strength of the first magnet and a strength of the second magnet are selected such that, when the second magnet is within the predetermined distance from the first magnet, a magnetic field from a pole of the first magnet and a magnetic field from a pole of the second magnet produce a magnetic attraction force between the first magnet and the second magnet meeting a threshold holding force.

9. The device of claim 1, wherein the magnetic sensor includes a first unipolar Hall Effect sensor configured to be triggered by magnetic field of the first polarity, and a second unipolar Hall Effect sensor configured to be triggered by magnetic field of the second polarity.

10. The device of claim 1, wherein the magnetic sensor and the first magnet are positioned within a body of a case, and the second magnet and the third magnet are positioned within a lid of the case; and wherein one or more processors of the case are configured to determine whether the case is open or closed based on at least one of the first output and the second output.

11. The device of claim 1, wherein the magnetic sensor and the first magnet are positioned within a body of a case for housing one or more wireless devices, and the second magnet and the third magnet are positioned within the one or more wireless devices; and wherein one or more processors of the case are configured to determine whether the one or more wireless devices are positioned inside the case based on at least one of the first output and the second output.

12. The device of claim 1, wherein the magnetic sensor and the first magnet are positioned within one or more wireless devices, and the second magnet and the third magnet are positioned within a case for housing the one or more wireless devices; and wherein one or more processors of the one or more wireless devices are configured to determine whether the one or more wireless devices are positioned inside the case based on at least one of the first output and the second output.

13. A device, comprising:
a magnetic sensor, wherein a first output of the magnetic sensor is triggered by magnetic field having a first polarity and a second output of the magnetic sensor is triggered by magnetic field having a second polarity;
a first magnet; and
a second magnet,
wherein a strength of the second magnet is selected based on an operating point of the magnetic sensor such that, when the second magnet is within the predetermined distance from the first magnet, a magnetic field from a pole of the second magnet having the second polarity saturates the magnetic sensor.

14. The device of claim 13, wherein a strength of the first magnet or a distance between the first magnet and the magnetic sensor is selected such that when the second magnet is not within a predetermined distance from the first magnet, a magnetic field from the first magnet having the first polarity causes the first output and the second output to have a first set of values.

15. The device of claim 13, wherein, when the second magnet is within the predetermined distance from the first magnet, a magnetic field from the second magnet having the second polarity causes the first output and the second output to have a second set of values.

16. The device of claim 13, wherein the magnetic sensor and the first magnet are positioned within a body of a case, and the second magnet is positioned within a lid of the case; and wherein one or more processors of the case are configured to determine whether the case is open or closed based on at least one of the first output and the second output.

17. The device of claim 13, wherein the magnetic sensor and the first magnet are positioned within a body of a case for housing one or more wireless devices, and the second magnet is positioned within the one or more wireless devices; and wherein one or more processors of the case are configured to determine whether the one or more wireless devices are positioned inside the case based on at least one of the first output and the second output.

18. A case, comprising:
a body;
a lid, the lid moveable with respect to the body between an opening and a closing position;
a magnetic sensor positioned at the body, wherein a first output of the magnetic sensor is triggered by magnetic field having a first polarity and a second output of the magnetic sensor is triggered by magnetic field having a second polarity;
a first magnet positioned at the body; and
a second magnet positioned at the lid,
wherein a strength of the first magnet or a distance between the first magnet and the magnetic sensor is selected such that when the lid is in the opening position and the case is open, a magnetic field from the first magnet having the first polarity causes the first output and the second output to have a first set of values, and a magnetic field from a pole of the first magnet having the first polarity saturates the magnetic sensor.

19. The case of claim 18, further comprising a third magnet positioned at the lid, the third magnet being positioned at a fixed distance from the second magnet, wherein, when the lid is the closing position and the case is closed, a magnetic field from the third magnet having the second polarity causes the first output and the second output to have a second set of values.

20. The case of claim 18, wherein, when the second magnet is within the predetermined distance from the first magnet, a magnetic field from a pole of a third magnet having the second polarity saturates the magnetic sensor.

* * * * *